US012354946B2

(12) United States Patent
He et al.

(10) Patent No.: US 12,354,946 B2
(45) Date of Patent: Jul. 8, 2025

(54) DELAMINATION CONTROL OF DIELECTRIC LAYERS OF INTEGRATED CIRCUIT CHIPS

(71) Applicant: Taiwan Semiconductor Manufacturing Company, Ltd., Hsinchu (TW)

(72) Inventors: Jun He, Zhubei (TW); Li-Hsien Huang, Zhubei (TW); Yao-Chun Chuang, Hsinchu (TW); Chih-Lin Wang, Zhubei (TW); Shih-Kang Tien, Hsinchu (TW)

(73) Assignee: Taiwan Semiconductor Manufacturing Company, Ltd.

( * ) Notice: Subject to any disclaimer, the term of this patent is extended or adjusted under 35 U.S.C. 154(b) by 439 days.

(21) Appl. No.: 17/832,489

(22) Filed: Jun. 3, 2022

(65) Prior Publication Data
US 2023/0178475 A1    Jun. 8, 2023

Related U.S. Application Data

(60) Provisional application No. 63/286,404, filed on Dec. 6, 2021.

(51) Int. Cl.
*H01L 23/522* (2006.01)
*H01L 23/528* (2006.01)
(Continued)

(52) U.S. Cl.
CPC ...... *H01L 23/5226* (2013.01); *H01L 23/5283* (2013.01); *H01L 23/53295* (2013.01);
(Continued)

(58) Field of Classification Search
CPC ......... H01L 23/5226; H01L 21/823475; H01L 23/5283; H01L 23/53295;
(Continued)

(56) References Cited

U.S. PATENT DOCUMENTS 9,831,156 B2    11/2017    Lin
2019/0221535 A1*    7/2019    Shin .................. H01L 22/34
(Continued)

FOREIGN PATENT DOCUMENTS

TW    201505154 A    2/2015

*Primary Examiner* — Kyoung Lee
*Assistant Examiner* — Sophia W Kao
(74) *Attorney, Agent, or Firm* — Sterne, Kessler, Goldstein & Fox P.L.L.C.

(57) ABSTRACT

A chip package and a method of fabricating the same are disclosed. The chip package includes a substrate with a first region, a second region surrounding the first region, and a third region surrounding the second region, a device layer disposed on the substrate, a via layer disposed on the device layer, an interconnect structure disposed on the via layer, and a stress buffer layer with tapered side profiles disposed on the interconnect structure. First and second portions of the via layer above the first and second regions include first and second set of vias. First, second, and third portions of the interconnect structure above the first, second, and third regions include conductive lines connected to the devices, a first set of dummy metal lines connected to the second set of vias, and a second set of dummy metal lines.

20 Claims, 28 Drawing Sheets

(51) Int. Cl.
*H01L 23/532* (2006.01)
*H01L 25/10* (2006.01)
*H10D 84/01* (2025.01)
*H10D 84/03* (2025.01)

(52) U.S. Cl.
CPC ....... *H10D 84/0149* (2025.01); *H10D 84/038* (2025.01); *H01L 25/105* (2013.01); *H01L 2225/1058* (2013.01); *H10D 84/0158* (2025.01)

(58) Field of Classification Search
CPC ........... H01L 21/823431; H01L 25/105; H01L 2225/1058; H01L 29/0673; H01L 29/66439; H01L 29/775; H01L 23/562; H01L 23/3114; H01L 21/6835; H01L 21/76816; H01L 23/522; H01L 23/528; H01L 23/585; H01L 2221/68345; H01L 2221/68359; B82Y 10/00
See application file for complete search history.

(56) References Cited

U.S. PATENT DOCUMENTS

| | | | |
|---|---|---|---|
| 2020/0058543 A1* | 2/2020 | Han | H01L 23/544 |
| 2020/0152608 A1 | 5/2020 | Hu et al. | |
| 2020/0212914 A1 | 7/2020 | Lee et al. | |
| 2021/0183693 A1* | 6/2021 | Costa | H01L 23/3128 |
| 2022/0246524 A1* | 8/2022 | Chen | H01L 21/56 |
| 2022/0302034 A1* | 9/2022 | Chen | H01L 23/585 |

\* cited by examiner

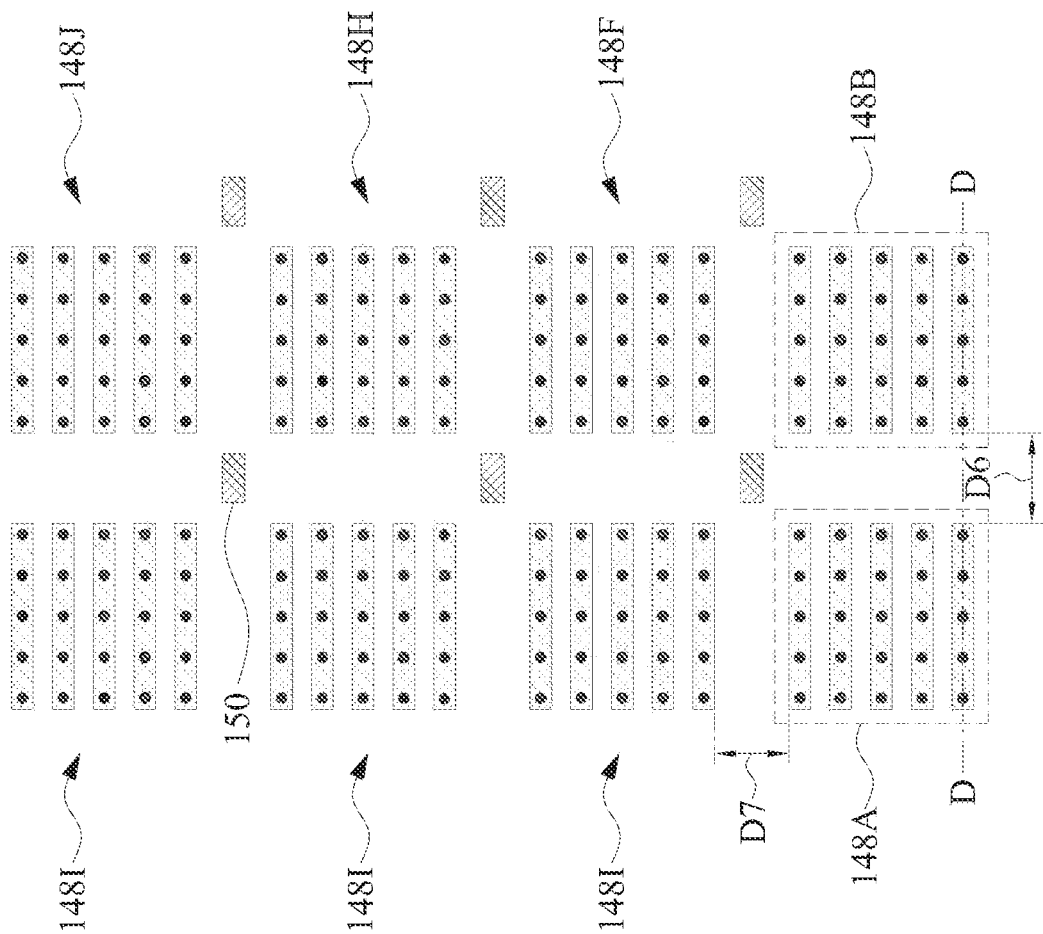

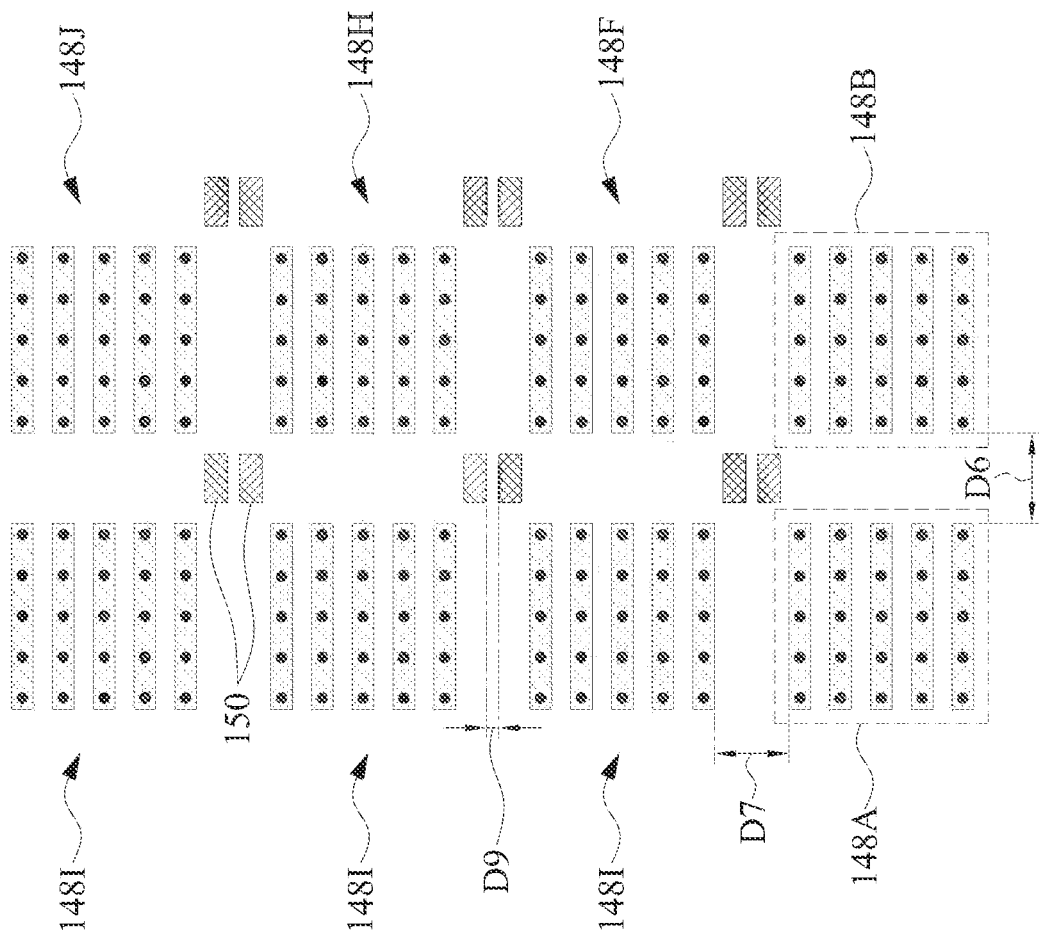
FIG. 1G
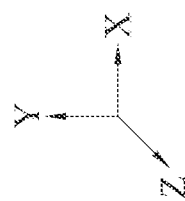

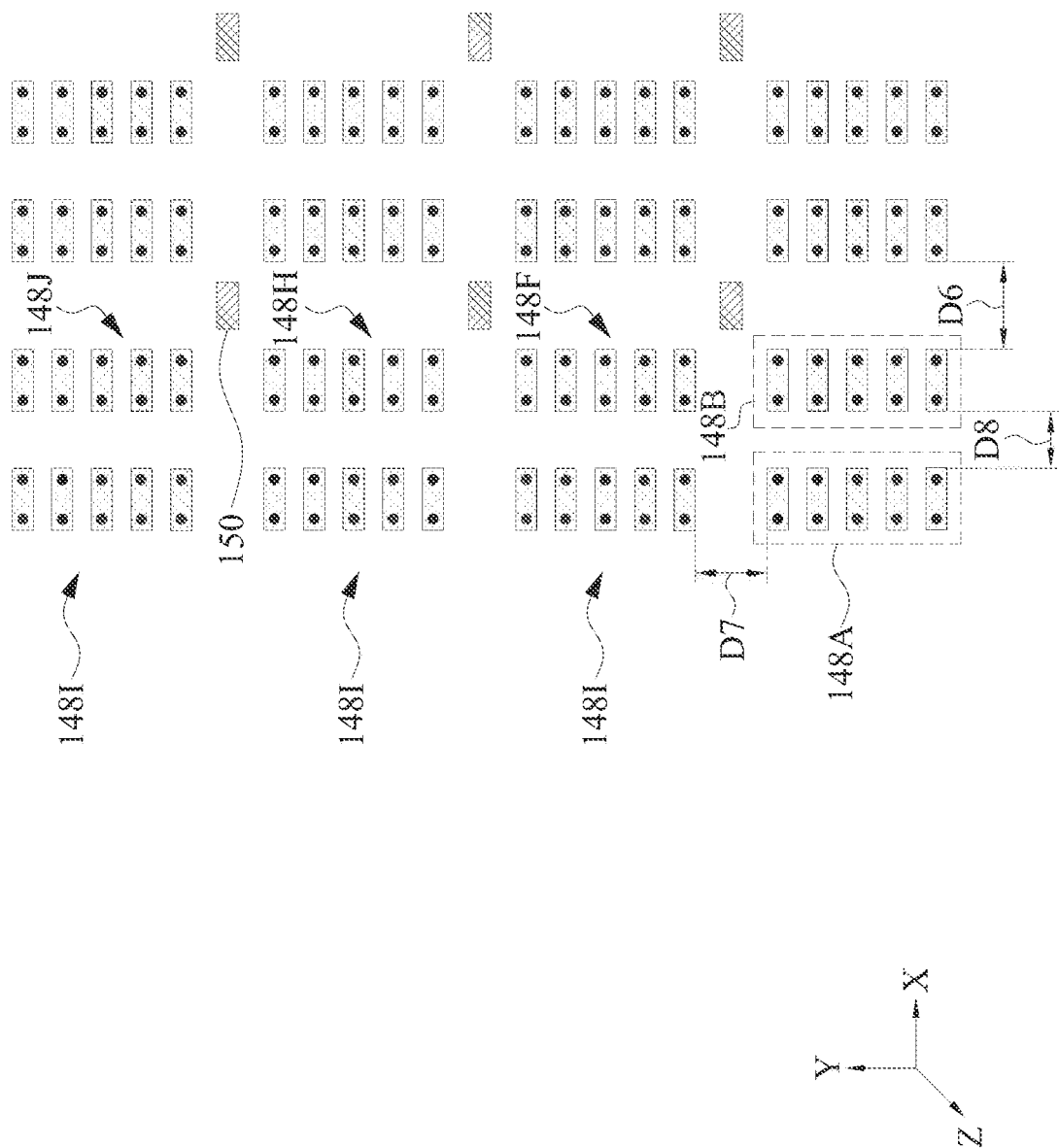

DELAMINATION CONTROL OF DIELECTRIC LAYERS OF INTEGRATED CIRCUIT CHIPS

CROSS-REFERENCE TO RELATED APPLICATIONS

This application claims the benefit of U.S. Provisional Patent Application No. 63/286,404, titled "Interconnect Structures with a Dummy Metal Design for Improved Reliability," filed on Dec. 6, 2021, the disclosure of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (finFETs), and gate-all-around (GAA) FETs in integrated circuit (IC) chips. Such scaling down has increased the complexity of packaging the IC chips.

BRIEF DESCRIPTION OF THE DRAWINGS

Aspects of this disclosure are best understood from the following detailed description when read with the accompanying figures.

FIGS. 1F-1H illustrate top-down views of an interconnect structure of IC chip packages, in accordance with some embodiments.

FIGS. 1I-1J illustrate top-down views of an IC chip of an IC chip package, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
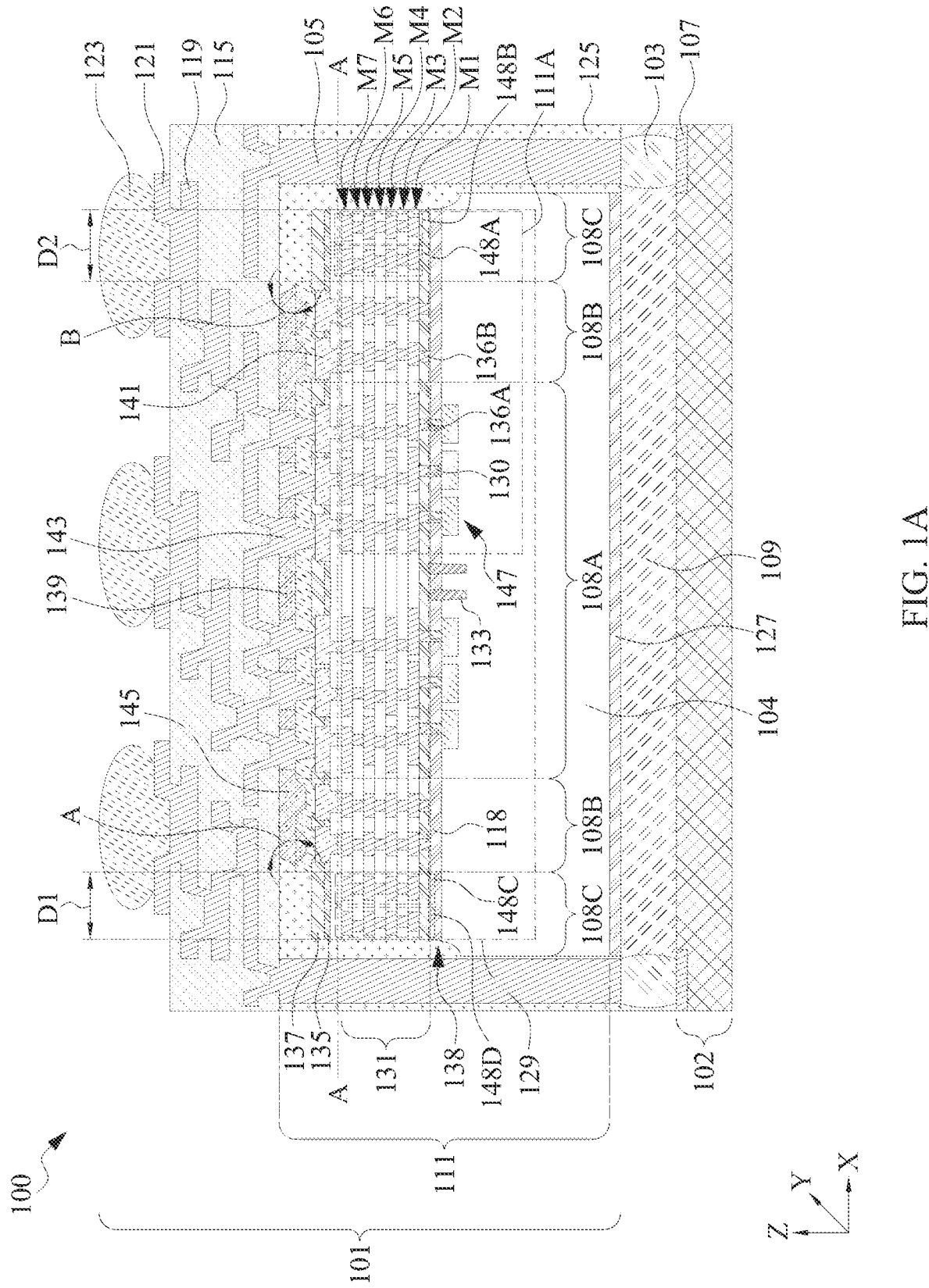
FIG. 1A illustrates a cross-sectional view of an IC chip package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example structures of IC chip packages (e.g., integrated fan-out (InFO) packages) and example methods of fabricating the same to reduce or prevent delamination of dielectric layers in IC chips and consequently improve IC chip reliability for higher IC chip performance. In some embodiments, the IC chip packages can include one or more IC chips, which can include a device region, a seal-ring region surrounding the device region, and a scribe lane region surrounding the seal-ring region. In some embodiments, the device region can include a device layer disposed on a substrate, a via layer disposed on the device layer, an interconnect structure disposed on the via layer, passivation layers disposed on the interconnect structure, and a stress buffer layer disposed on the passivation layers. In some embodiments, a portion of the device layer in the device region can include electrically active semiconductor devices (e.g., GAA FETs, finFETs, or MOSFETs). In some embodiments, portions of the device layer in the seal-ring region and the scribe lane region do not include semiconductor devices. In some embodiments, the portion of the device layer in the scribe lane region can include test structures and/or electrically inactive ("dummy") semiconductor devices.

In some embodiments, a portion of the interconnect structure in the device region can include an electrically conductive structure of conductive lines and conductive vias that can be connected to power supplies and/or electrically active devices. In some embodiments, a portion of the interconnect structure in the seal-ring region can include a seal-ring metal structure ("SR metal structure"), and a portion of the interconnect structure in the scribe lane region can include a scribe lane metal structure ("SL metal structure"). The SR metal structure and the SL metal structure can include dummy metal lines and dummy metal vias that are not connected to power supplies or electrically active devices.

In some embodiments, the SR metal structure can protect the structures in the device region during the fabrication and/or the packaging of the IC chip. In some embodiments, the SR metal structure is disposed on and physically connected to metal vias in the via layer. The physical connection of the SR metal structure with the metal vias can prevent or reduce the delamination of dielectric layers in the interconnect structure and in the device layer. The delamination of dielectric layers can occur as a result of lateral mechanical and/or thermal stress induced in portions of the interconnect structure and the device layer close to the corners and side edges of the IC chip during a die-singulation process of the IC chip fabrication. In some embodiments, the number of metal vias in the via layer physically connected to the SR metal structure is greater than 10 and the width of each metal via is about 20 nm to about 60 nm for adequately preventing the delamination of dielectric layers or for reducing the delamination length in the dielectric layers.

In some embodiments, the SL metal structure can include an array of conductive stacks, each of which can include a stack dummy metal lines and dummy metal vias in various configurations. Based on the arrangement of the conductive stacks in the scribe lane region, the delamination of dielectric layers in the interconnect structure and in the device layer can be prevented or reduced. In some embodiments, the conductive stacks can be arranged in the scribe lane region (i) to have a distance of about 40 nm to about 160 nm between adjacent conductive stacks, and (ii) to cover less than or equal to about 50% (e.g., about 30% to about 50%) of the total surface area of the scribe lane region for adequately preventing the delamination of dielectric layers or for reducing the delamination length in the dielectric layers.

In some embodiments, by (i) physically connecting the SR metal structure to more than 10 metal vias in the via layer, (ii) spacing the conductive stacks of the SL metal structure with a distance of about 40 nm to about 160 nm from each other, and/or (iii) arranging the conductive stacks to cover less than or equal to about 50% of the total surface area of the scribe lane region, the delamination length in the dielectric layers can be reduced by about 80% to about 90% (e.g., can be reduced from about 7 µm to less than about 1 µm) compared to IC chips without the above described configurations of the SR metal structure and the SL metal structure.

In some embodiments, the example method for fabricating the IC chip can include forming the device layer, via layer, the interconnect structure, passivation layers, and stress buffer layer on a wafer followed by a three-stage die-singulation process and a packaging process. In some embodiments, a first stage of the die-singulation process can include removing portions of the stress buffer layer from the scribe lane region using a lithographic process. In some embodiments, a second stage of the die-singulation process can include forming a trench in the wafer along the scribe lane region by removing portions of the passivation layers, the interconnect structure, the via layer, the device layer, and wafer from the scribe lane region using a laser grooving process. In some embodiments, a third stage of the die-singulation process can include dicing the wafer through the trench using a wafer saw process.

By using the three-stage die-singulation process having the lithographic process, a lower power density laser (e.g., about 30% to about 50% lower) can be used for the laser grooving process in the second stage compared to a laser used in a two-stage die-singulation process, which does not include a lithographic process. In the two-stage die-singulation process, a higher power density laser is used since the laser is used to remove portions of the stress buffer layer along with portions of the passivation layers, the interconnect structure, the via layer, the device layer, and the wafer prior to the wafer saw process. Lowering the laser power density during the three-stage die-singulation process can substantially reduce or prevent the delamination of dielectric layers in the interconnect structures and in the device layer, and formation of voids in metal lines of the interconnect structure in the IC chips. As a result, the IC chips formed after the three-stage die-singulation process have sharper edge profiles and about 10 times higher IC chip reliability than that of IC chips formed after the two-stage die-singulation process.

FIG. 1A illustrates a cross-sectional view of an IC chip package 100 having a first IC chip package 101 and a second IC chip package 102, according to some embodiments. In some embodiments, IC chip package 100 can have a package structure of an integrated fan-out (InFO) package-on-package (PoP) with first IC chip package 101 stacked on second IC chip package 102. In some embodiments, first IC chip package 101 and second IC chip package 102 can be similar to or different from each other. In some embodiments, first IC chip package 101 can include a system-on-chip (SoC) package and second IC chip package 102 can include a memory chip package (e.g., a dynamic random access memory (DRAM) chip package). In some embodiments, first IC chip package 101 and second IC chip package 102 can be mechanically and electrically coupled to each other through inter-package connectors 103, through-vias 105 of first IC chip package 101, and contact pads 107 of second IC chip package. In some embodiments, inter-package connectors 103 can include conductive bonding structures. In some embodiments, a sealing layer 109 can be disposed in regions between first IC chip package 101 and second IC chip package 102 that are not occupied by inter-package connectors 103. In some embodiments, sealing layer 109 can include a resin material with silica particles, an epoxy material, or other suitable sealant materials.

In some embodiments, first IC package 101 can include (i) an IC chip 111, (ii) a dielectric layer 115 disposed on a front side surface of IC chip 111, (iii) redistribution layers (RDLs) 119 disposed in dielectric layer 115, (iv) metal contact pads 121 disposed on dielectric layer 115 and in electrical contact with RDLs 119, (v) conductive bonding structures 123 disposed on metal contact pads 121, (vi) a molding layer 125 surrounding IC chip 111, (vii) conductive through-vias 105 disposed in molding layer 125 and adjacent to IC chip 111, and (viii) die attach film 127 disposed on a back side surface of IC chip 111.

In some embodiments, RDLs 119 can be electrically connected to semiconductor devices of device layer 129 (discussed below) of IC chip 111 through conductive vias 143 of IC chip 111 (discussed below) and can electrically connect the semiconductor devices to second IC chip package 102 through conductive through-vias 105 and conductive vias 143. RDLs 119 can be configured to fan out IC chip 111 such that I/O connections (not shown) on IC chip 111 can be redistributed to a greater area than IC chip 111, and consequently increase the number of I/O connections of IC chip 111. In some embodiments, conductive bonding structures 123 can be electrically connected to RDLs 119 through metal contact pads 121. In some embodiments, conductive bonding structures 123 can electrically connect first IC chip package 101 to a printed circuit board (PCB).

In some embodiments, conductive through-vias 105, metal contact pads 121, and RDLs 119 can include a material similar to or different from each other. In some embodiments, conductive through-vias 105, metal contact pads 121, and RDLs 119 can include a metal (such as copper and aluminum), a metal alloy (such as copper alloy and aluminum alloy), or a combination thereof. In some embodiments conductive through-vias 105, metal contact pads 121, and RDLs 119 can include a titanium liner and a copper fill. The titanium liner can be disposed on bottom surfaces and sidewalls of conductive through-vias 105, metal contact pads 121, and RDLs 119. In some embodiments, dielectric layer 115 can include a stack of dielectric layers. In some embodiments, molding layer 125 can include a resin material or an epoxy material.

Figure 1B:
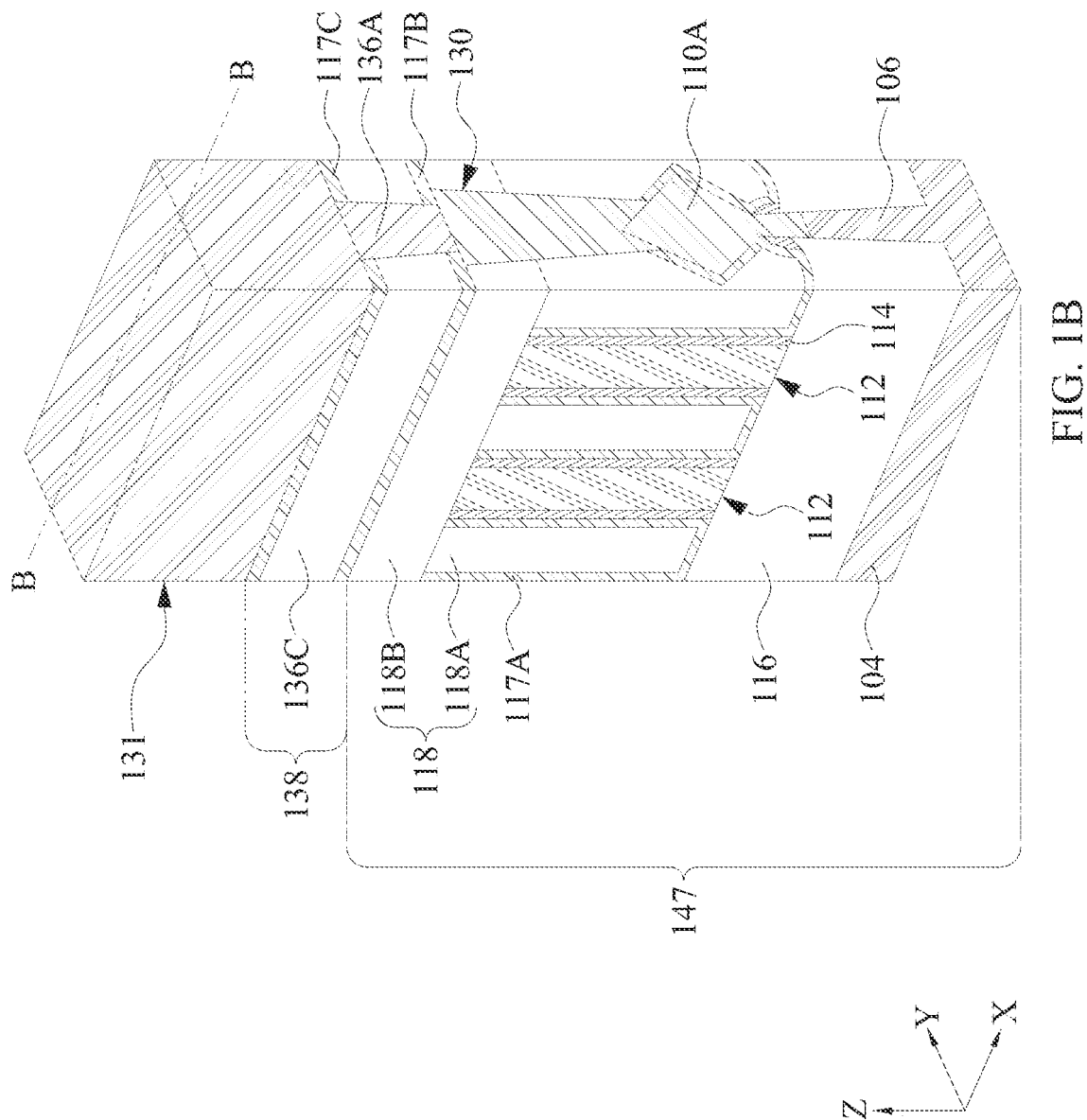
FIGS. 1B-1D illustrate isometric and cross-sectional views of a semiconductor device and an interconnect structure of an IC chip package, in accordance with some embodiments.
Figure 1C:
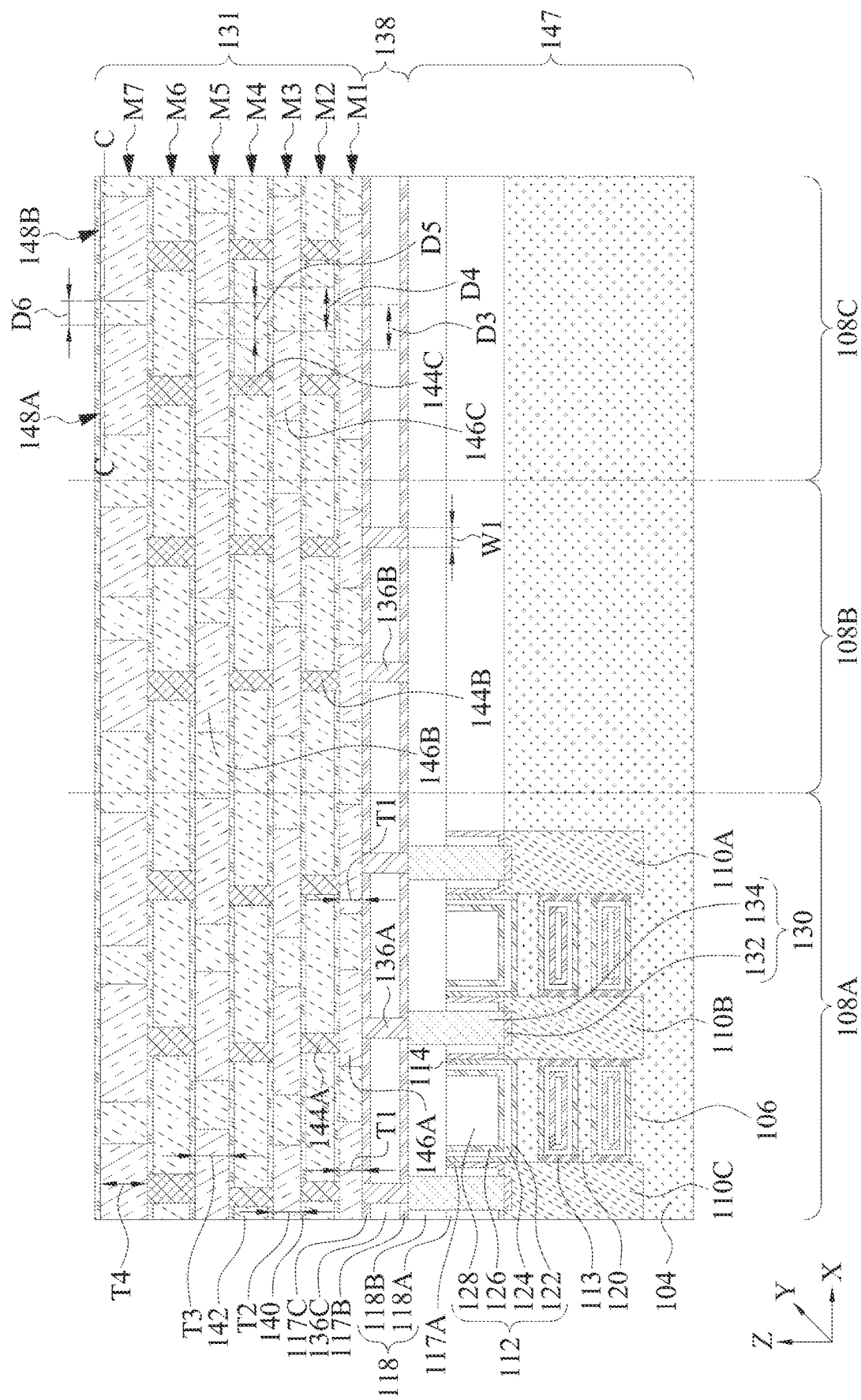
Figure 1D:
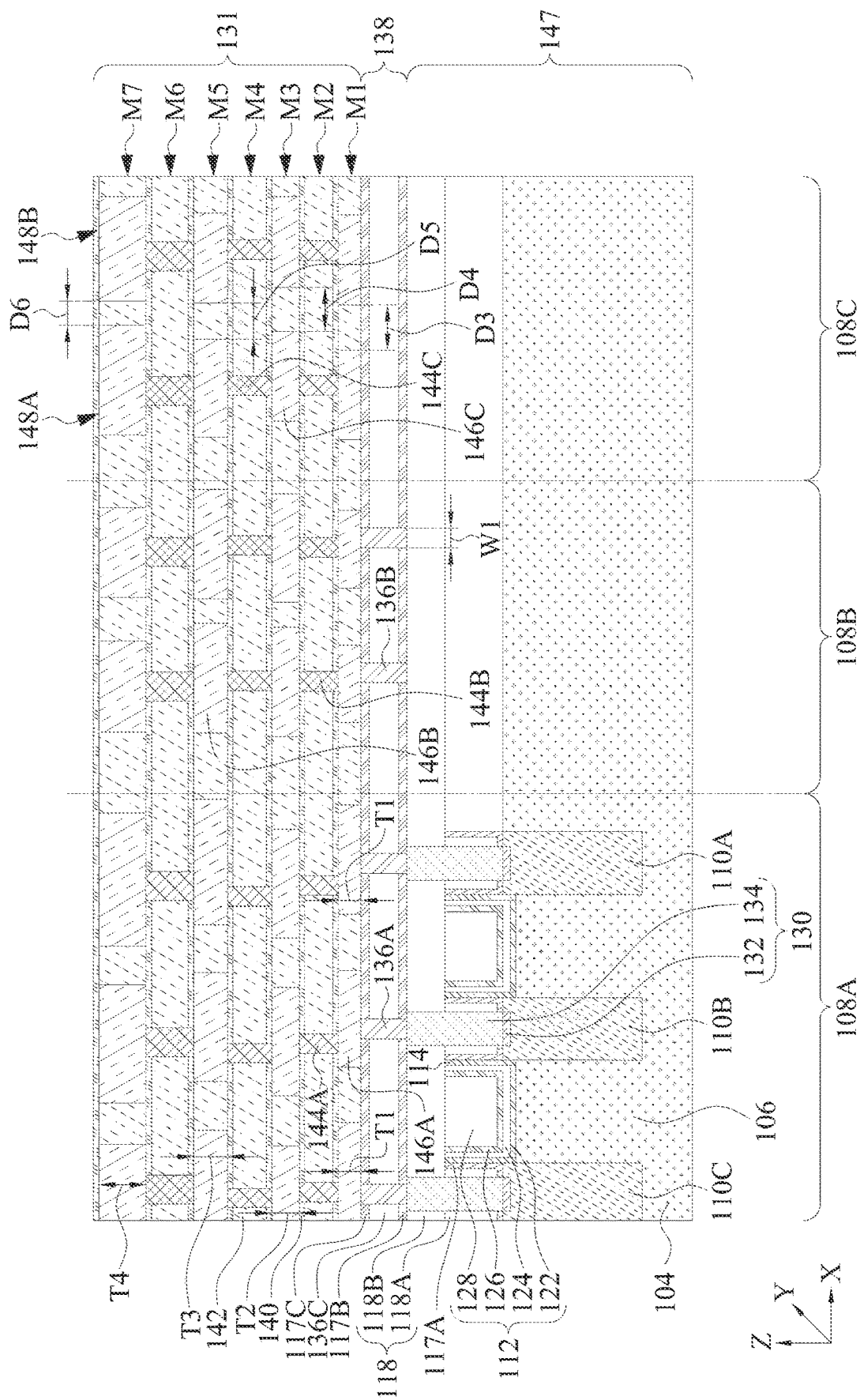
Figure 1E:
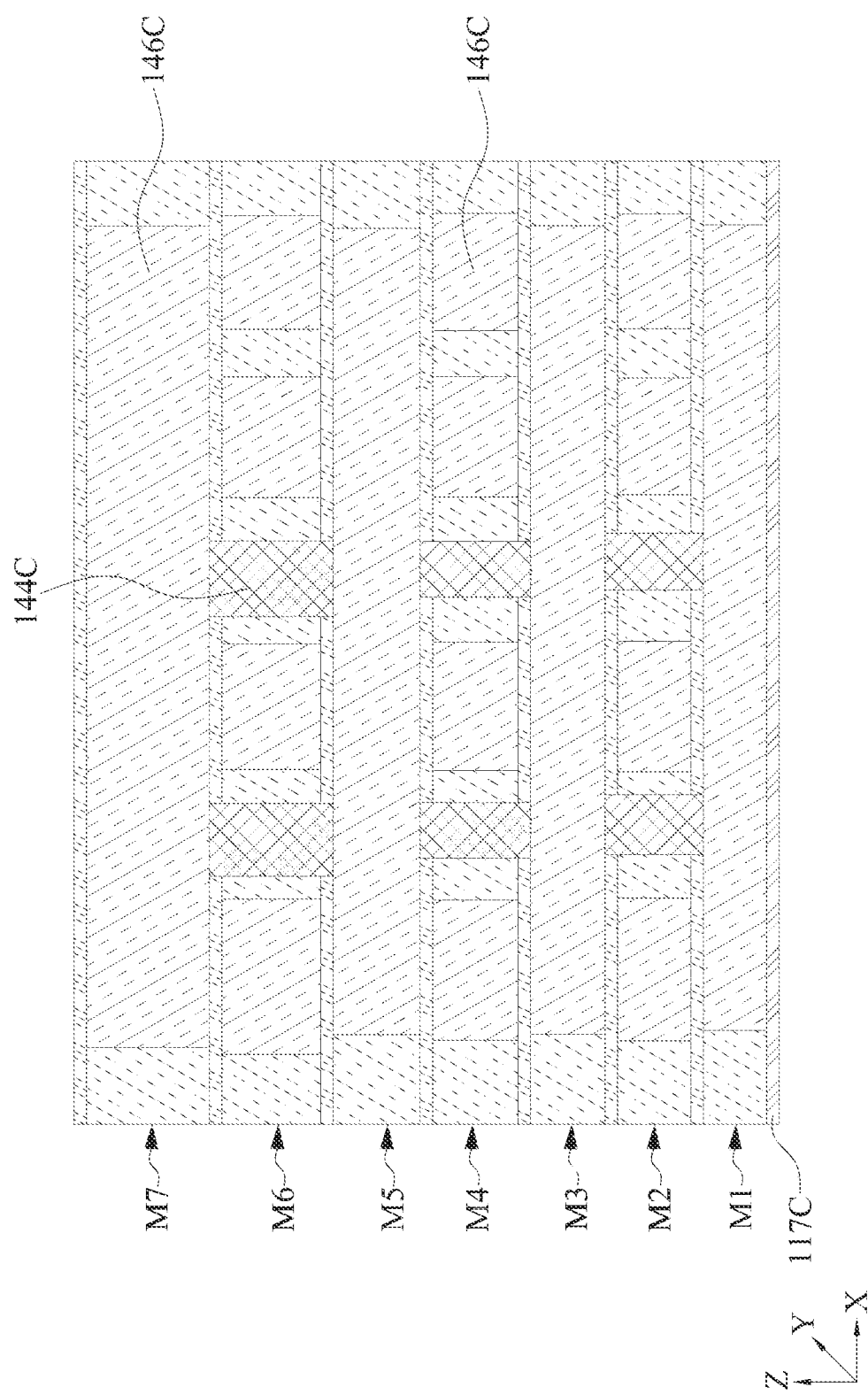
FIG. 1E illustrates a cross-sectional view of an interconnect structure of an IC chip package, in accordance with some embodiments.
Figure 1J:
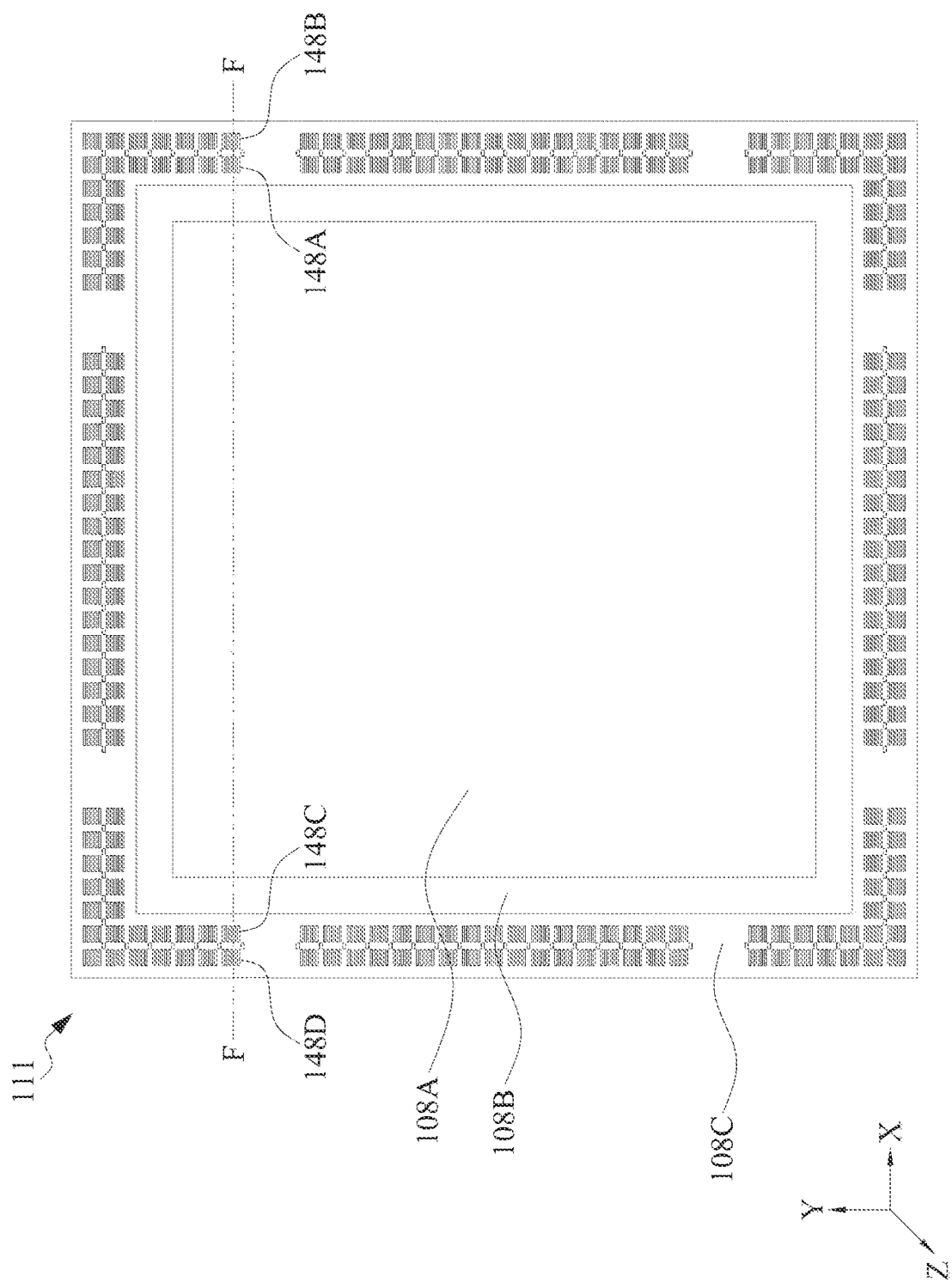

IC chip 111 is described with reference to FIGS. 1A-1J. FIGS. 1B-1D are enlarged views of region 111A of FIG. 1A, according to some embodiments. FIG. 1B illustrates an isometric view of the structures in region 111A, according to some embodiments. FIGS. 1C and 1D illustrate different cross-sectional views along line B-B of FIG. 1B with additional structures that are not shown in FIG. 1B for simplicity, according to some embodiments. FIG. 1E illustrates a different cross-sectional view of a portion of IC chip 111, according to some embodiments. FIGS. 1F-1H illustrate different top-down views of IC chip 111 along line C-C of FIG. 1C, according to some embodiments. FIGS. 1I-1J illustrate different top-down views of IC chip 111 along line A-A of FIG. 1A, according to some embodiments. The discussion of elements in FIGS. 1A-1J with the same annotations applies to each other, unless mentioned otherwise.

In some embodiments, IC chip 111 can include (i) a device region 108A, (ii) a seal-ring region 108B surrounding device region 108A, and (iii) a scribe lane region 108C surrounding seal-ring region 108B. As described in detail below, in some embodiments, device region 108A can include electrically active devices and structures, and seal-ring region 108B and scribe lane region 108C can include electrically inactive ("dummy") metal structures. In some embodiments, seal-ring region 108B and scribe lane region 108C do not include electrically active devices and structures. In some embodiments, scribe lane region 108C can include test structures and/or dummy semiconductor devices. In some embodiments, the structures in seal-ring region 108B can protect the structures in device region 108A by providing a barrier to the diffusion of processing chemicals (e.g., etchants) and/or moisture during the fabrication and/or the packaging of IC chip 111.

In some embodiments, IC chip 111 can include (i) a substrate 104, (ii) a device layer 129 disposed on substrate 104, (iii) a via layer 138 disposed on device layer 129, (iv) an interconnect structure 131 disposed on via layer 138, (v) an oxide layer 135 disposed on interconnect structure 131, (vi) a nitride layer 137 disposed on oxide layer 135, (vii), conductive pads 141 disposed on portions of interconnect structure 131 in device region 108A and seal-ring region 108B, (viii) a polymer layer 139 disposed on conductive pads 141 and on portions of nitride layer 137 in device region 108A and seal-ring region 108B, (ix) conductive vias 143 disposed on conductive pads 141 in device region 108A, and (x) a stress buffer layer 145 disposed on polymer layer 139.

In some embodiments, substrate 104 can be a semiconductor material, such as silicon, germanium (Ge), silicon germanium (SiGe), a silicon-on-insulator (SOI) structure, other suitable semiconductor materials, and a combination thereof. Further, substrate 104 can be doped with p-type dopants (e.g., boron, indium, aluminum, or gallium) or n-type dopants (e.g., phosphorus or arsenic).

In some embodiments, conductive vias 143 can be electrically connected to the portion of interconnect structure 131 in device region 108A through conductive pads 141. In some embodiments, seal-ring region 108B and scribe lane region 108C do not include conductive vias 143, and scribe lane region 108C does not include conductive pads 141. In some embodiments, conductive vias 143 can include (i) a conductive material, such as copper (Cu), aluminum (Al), tungsten (W), titanium (Ti), tantalum (Ta), titanium nitride (TiN), tantalum nitride (TaN), titanium aluminum (TiAl), titanium aluminum nitride (TiAlN), and tungsten nitride (WN); (ii) a metal alloy, such as copper alloys and aluminum alloys; and (iii) a combination thereof. In some embodiments conductive vias 143 can include a titanium (Ti) liner and a copper (Cu) fill. The titanium liner can be disposed on bottom surfaces and sidewalls of conductive vias 143. Conductive vias 143 can have top surfaces in physical contact with RDLs 119 and bottom surfaces in physical contact with conductive pads 141. In some embodiments, conductive pads 141 can include aluminum.

In some embodiments, conductive vias 143 can be electrically isolated from each other by polymer layer 139. In some embodiments, polymer layer 139 can include polybenzoxazole (PBO), benzocyclobutene (BCB), or a suitable polymer. In some embodiments, oxide layer 135 can include silicon oxide ($SiO_2$) or another suitable oxide-based dielectric material. In some embodiments, nitride layer 137 can include silicon nitride (SiN) or another suitable nitride-based dielectric material that can provide moisture control to interconnect structure 131 and device layer 129 during the formation of structures overlying nitride layer 137 and/or during the packaging of IC chip 111. In some embodiments, oxide layer 135 and nitride layer 137 can be referred to as passivation layers.

In some embodiments, stress buffer layer 145 can mitigate the mechanical and/or thermal stress induced during packaging of IC chip 111, such as during the formation of molding layer 125, during the formation of RDLs 119, and/or during the formation of conductive bonding structures 123. In some embodiments, stress buffer layer 145 can also mitigate thermal stress induced in conductive vias 143, oxide layer 135, nitride layer 137, and/or other dielectric layers underlying oxide layer 135 during a three-stage die-singulation process (described in detail below) used in the formation of IC chip 111. As a result, stress buffer layer 145 can reduce the risk of delamination of oxide layer 135, nitride layer 137, and/or other dielectric layers underlying oxide layer 135 during the three-stage die-singulation process. In some embodiments, stress buffer layer 145 can be formed with a tapered structure, as shown in FIG. 1A, for substantially uniform distribution of stress on the underlying layers, such as oxide layer 135, nitride layer 137, and dielectric layers of interconnect structure 131. The tapered side profiles of stress buffer layer 145 can provide a more uniform distribution of stress than that provided by stress buffer layers with vertical side profiles.

In some embodiments, the tapered sidewalls of stress buffer layer 145 can form angles A and B with top surface of polymer layer 139 or with an X-axis. In some embodiments, angles A and B can be equal to or different from each other. In some embodiments, angles A and B can be greater than about 50 degrees and less than about 90 degrees. In some embodiments, bottom edges of stress buffer layer 145 are distances D1 and D2 away from edges of IC chip 111, as shown in FIG. 1A. In some embodiments, distances D1 and D2 can be similar to or different from each other and can be greater than about 1 μm and less than about 10 μm. These dimension ranges can configure stress buffer layer 145 to adequately buffer and/or substantially uniformly distribute the stress induced during the packaging of IC chip 111 and/or during the three-stage die-singulation process.

In some embodiments, stress buffer layer 145 can include a dielectric material, such a low-k dielectric material with a dielectric constant (k) less than about 3.5, an undoped silicate glass (USG), and a fluorinated silica glass (FSG). In some embodiments, stress buffer layer 145 can include a polymeric material, such as polyimide, polybenzoxazole (PBO), an epoxy-based polymer, a phenol-based polymer, and benzocyclobutene (BCB). In some embodiments, stress buffer layer 145 can include a photo-sensitive material, which can be patterned with a lithographic process to form the structure shown in FIG. 1A.

Referring to FIG. 1A, in some embodiments, the portion of device layer 129 in device region 108A can include semiconductor devices, such as GAA FETs, finFETs, and MOSFETs, which can be isolated from each other with shallow trench isolation (STI) regions 133. In some embodiments, the portions of device layer 129 in seal-region 108B and scribe lane region 108C do not include semiconductor devices.

FIG. 1B illustrates an isometric view of a FET 147 of device layer 129, via layer 138, and interconnect structure 131 in region 111A of FIG. 1A, according to some embodiments. The elements of interconnect structure 131 are not shown in FIG. 1B for simplicity. In some embodiments, FET 147 can represent n-type FET 147 (NFET 147) or p-type FET 147 (PFET 147) and the discussion of FET 147 applies to both NFET 147 and PFET 147, unless mentioned otherwise. In some embodiments, FET 147 can be formed on substrate 104 and can include an array of gate structures 112 disposed on a fin structure 106 and an array of S/D regions 110A-110C (S/D region 110A visible in FIG. 1B; 110A-110C visible in FIGS. 1C and 1D) disposed on portions of fin structure 106 that are not covered by gate structures 112. In some embodiments, fin structure 106 can include a material similar to substrate 104 and extend along an X-axis. In some embodiments, FET 147 can further include gate spacers 114, STI regions 116, etch stop layer (ESL) 117A, and inter layer dielectric (ILD) layers 118A-118B. In some embodiments, gate spacers 114, STI regions 116, ESLs 117A, and ILD layers 118A-118B can include an insulating material, such as silicon oxide, silicon nitride (SiN), silicon carbon nitride (SiCN), silicon oxycarbon nitride (SiOCN), and silicon germanium oxide.

Referring to FIG. 1C, in some embodiments, FET 147 can be a GAA FET 147 and can include (i) S/D regions 110A-110C, (ii) contact structures 130 disposed on S/D regions 110A-110C, (iii) via structures 136 disposed on contact structures 130, (iv) nanostructured channel regions 120 disposed on fin structure 106, and (v) gate structures 112 surrounding nanostructured channel regions 120. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, or about 10 nm; other values less than about 100 nm are within the scope of the disclosure. In some embodiments, FET 147 can be a finFET 147, as shown in FIG. 1D.

In some embodiments, nanostructured channel regions 120 can include semiconductor materials similar to or different from substrate 104. In some embodiments, nanostructured channel regions 120 can include Si, SiAs, silicon phosphide (SiP), SiC, SiCP, SiGe, silicon germanium boron (SiGeB), germanium boron (GeB), silicon germanium stannum boron (SiGeSnB), a III-V semiconductor compound, or other suitable semiconductor materials. Though rectangular cross-sections of nanostructured channel regions 120 are shown, nanostructured channel regions 120 can have cross-sections with other geometric shapes (e.g., circular, elliptical, triangular, or polygonal). Gate portions of gate structures 112 surrounding nanostructured channel regions 120 can be electrically isolated from adjacent S/D regions 110A-110C by inner spacers 113. Inner spacers 113 can include an insulating material, such as $SiO_x$, SiN, SiCN, SiOCN, and other suitable insulating materials.

Each of gate structures 112 can include (i) an interfacial oxide (IO) layer 122, (ii) a high-k (HK) gate dielectric layer 124 disposed on IO layer 122, (iii) a work function metal (WFM) layer 126 disposed on HK gate dielectric layer 124, and (iv) a gate metal fill layer 128 disposed on WFM layer 126. As used herein, the term "high-k" refers to a high dielectric constant. In the field of semiconductor device structures and manufacturing processes, high-k refers to a dielectric constant that is greater than the dielectric constant of $SiO_2$ (e.g., greater than about 3.9). IO layers 122 can include silicon oxide ($SiO_2$), silicon germanium oxide ($SiGeO_x$), germanium oxide ($GeO_x$), or other suitable oxide materials. HK gate dielectric layers 124 can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), and other suitable high-k dielectric materials.

For NFET 147, WFM layer 126 can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based conductive materials, or a combination thereof. For PFET 147, WFM layer 126 can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu), other suitable substantially Al-free conductive materials, or a combination thereof. Gate metal fill layers 128 can include a conductive material, such as tungsten (W), Ti, silver (Ag), ruthenium (Ru), molybdenum (Mo), copper (Cu), cobalt (Co), Al, iridium (Ir), nickel (Ni), metal alloys, other suitable conductive materials, and a combination thereof.

For NFET 147, each of S/D regions 110A-110C can include an epitaxially-grown semiconductor material, such as Si, and n-type dopants, such as phosphorus and other suitable n-type dopants. For PFET 147, each of S/D regions 110A-110C can include an epitaxially-grown semiconductor material, such as Si and SiGe, and p-type dopants, such as boron and other suitable p-type dopants. In some embodiments, each of contact structures 130 can include (i) a silicide layer 132 disposed within each of S/D regions 110A-110C and (ii) a contact plug 134 disposed on silicide layer 132. In some embodiments, silicide layers 132 can include a metal silicide. In some embodiments, contact plugs 134 can include conductive materials with low resistivity (e.g., resistivity of about 50 $\mu\Omega$-cm, about 40 $\mu\Omega$-cm, about 30 $\mu\Omega$-cm, about 20 $\mu\Omega$-cm, or about 10 $\mu\Omega$-cm), such as cobalt (Co), tungsten (W), ruthenium (Ru), iridium (Ir), nickel (Ni), Osmium (Os), rhodium (Rh), aluminum (Al), molybdenum (Mo), other suitable conductive materials with low resistivity, and a combination thereof. In some embodiments, via structures 136 can be disposed on contact structures 130 and can include conductive materials, such as Ru, Co, Ni, Al, Mo, W, Ir, Os, Cu, and Pt. Contact structures 130 can electrically connect to overlying interconnect structure 131 through via structures 136.

Referring to FIGS. 1A-1D, in some embodiments, via layer 138 can include (i) ESLs 117B and 117C, (ii) ILD layer 136C disposed between ESLs 117B and 117C, (iii) vias 136A disposed in portions of ILD layer 136C and ESLs 117B and 117C in device region 108A, and (iv) vias 136B disposed in portions of ILD layer 136C and ESLs 117B and 117C in seal-ring region 108B. Via layer 138 does not have vias in scribe lane region 108C. In some embodiments, via layer 138 can electrically connect semiconductor devices (e.g., FET 147) in device layer to the portion of interconnect structure 131 in device region 108A through vias 136A. In some embodiments, vias 136A and 136B can include a conductive material, such as such as Ru, Co, Ni, Al, Mo, W, Ir, Os, Cu, and Pt. ILD layer 136C and ESLs 117B and 117C can include an insulating material, such as silicon oxide, silicon nitride (SiN), silicon carbon nitride (SiCN), silicon oxycarbon nitride (SiOCN), and silicon germanium oxide.

Referring to FIGS. 1A-1D, in some embodiments, interconnect structure 131 can be disposed on via layer 138. In some embodiments, interconnect structure 131 can include interconnect layers M1-M7. Though seven interconnect layers M1-M7 are discussed with reference to FIGS. 1A and 1C-1E, interconnect structure 131 can have any number of interconnect layers. Each of interconnect layers M1-M7 can include an ESL 140 and an ILD layer 142. ESLs 140 can include a dielectric material, such as aluminum oxide ($Al_xO_y$), nitrogen doped silicon carbide (SiCN), and oxygen doped silicon carbide (SiCO) with a dielectric constant ranging from about 4 to about 10.

In some embodiments, ILD layers 142 can include a low-k (LK) or extra low-k (ELK) dielectric material with a dielectric constant lower than that of silicon oxide (e.g., dielectric constant between about 2 and about 3.7). The LK or ELK dielectric material can reduce parasitic capacitances between interconnect layers M1-M7. In some embodiments, the LK or ELK dielectric material can include silicon oxycarbide (SiOC), nitrogen doped silicon carbide (SiCN), silicon oxycarbon nitride (SiCON), or oxygen doped silicon carbide. In some embodiments, ILD layers 142 can include one or more layers of insulating carbon material with a low dielectric constant of less than about 2 (e.g., ranging from about 1 to about 1.9). In some embodiments, the one or more layers of insulating carbon material can include one or more fluorinated graphene layers with a dielectric constant ranging from about 1 to about 1.5, or can include one or more graphene oxide layers.

In some embodiments, the portion of interconnect structure 131 in device region 108A can include electrically active (i) conductive lines 146A in each of interconnect layers M1, M3, MS, and M7, and (ii) conductive vias 144A in each of interconnect layers M2, M4, and M6. Conductive lines 146A and conductive vias 144A can be electrically connected to power supplies and/or active devices. The layout of conductive lines 146A and conductive vias 144A is exemplary and not limiting and other layout variations of conductive lines 146A and conductive vias 144A are within the scope of this disclosure. The number and arrangement of conductive lines 146A and conductive vias 144A in each of interconnect layers M1-M7 can be different from the ones shown in FIGS. 1A and 1C-1D. The routings (also referred to as "electrical connections") between FET 147 and the portion of interconnect structure 131 in device region are exemplary and not limiting. There may be routings between FET 147 and interconnect layers M1-M7 that are not visible in the cross-sectional view of FIGS. 1A and 1C-1D.

Each of conductive lines 146A can be disposed within ILD layer 142 and each of conductive vias 144A can be disposed within ILD layer 142 and a pair of ESLs 140 disposed on top and bottom surfaces of the corresponding ILD layer 142. Conductive vias 144A provide electrical connections between conductive lines 146A of adjacent interconnect layers. In some embodiments, conductive vias 144A can include an electrically conductive material, such as Cu, Ru, Co, Mo, a Cu alloy (e.g., Cu—Ru, Cu—Al, or copper-manganese (CuMn)), carbon nanotubes, graphene layers, and any other suitable conductive material. In some embodiments, conductive lines 146 can include electrically conductive material, such as Cu, Ru, Co, Mo, carbon nanotubes, graphene layers, and any other suitable conductive material. In some embodiments, conductive lines 146A and conductive vias 144A can include a metal liner (not shown) on which the conductive material is disposed. The metal liner can include a metal, such as tantalum, cobalt, and other suitable metals, or metal nitrides, such as titanium nitride, tantalum nitride, and other suitable metal nitrides. Conductive lines 146A and conductive vias 144A of one or more of interconnect layers M1-M7 can be single-damascene structures or dual-damascene structures. In some embodiments, thicknesses T1-T4 of conductive lines 146A can be substantially equal to or different from each other.

In some embodiments, the portion of interconnect structure 131 in seal-ring region 108B can include (i) dummy metal lines 146B in each of interconnect layers M1, M3, M5, and M7, and (ii) dummy metal vias 144B in each of interconnect layers M2, M4, and M6. The layout of dummy metal lines 146B and dummy metal vias 144B is exemplary and not limiting. The number and arrangement of dummy metal lines 146B and dummy metal vias 144B in each of interconnect layers M1-M7 can be different from the ones shown in FIGS. 1A and 1C-1D. Dummy metal lines 146B and dummy metal vias 144B are not electrically connected to power supplies and/or active devices. In some embodiments, the metal structure formed by dummy metal lines 146B and dummy metal vias 144B can protect the structures in device region 108A by providing a barrier to the diffusion of processing chemicals (e.g., etchants) and/or moisture during the fabrication and/or the packaging of IC chip 111.

In some embodiments, dummy metal lines 146B in interconnect layer M1 can be physically connected to vias 136B to prevent the delamination of dielectric layers or to reduce the delamination length in the dielectric layers (e.g., ILD layers 142, 136, 118A, and/or 118B). Though FIGS. 1A and 1C-1D show one via 136B connected to one dummy metal line 146B in in interconnect layer M1, each of dummy metal line 146B in interconnect layer M1 can be connected to one or more vias 136B. In some embodiments, one or more dummy metal lines 146B in interconnect layer M1 may not be connected to vias 136B. By physically connecting the stack of dummy metal lines 146B and dummy metal vias 144B to vias 136B, the lateral propagation of stress-induced damages in portions of interconnect structure 131 and device layer 129 close to the corners and side edges of IC chip 111 during IC chip fabrication (e.g., during a die-singulation process) can be prevented or minimized. As a result, the stress-induced delamination length in the dielectric layers can be reduced to less than about 1 μm.

In some embodiments, the total number of vias 136B in seal-ring region 108B and connected to dummy metal lines 146B in interconnect layer M1 can be greater than about 10 (e.g., about 11 to about 50) and vias 136B can have a width W1 of about 20 nm to about 60 nm. Within these dimension ranges and quantity ranges of via 136B, the delamination of dielectric layers can be adequately prevented or the delamination length in the dielectric layers can be significantly reduced without compromising the size and manufacturing cost of IC chip.

In some embodiments, the portion of interconnect structure 131 in scribe lane region 108C can include (i) dummy metal lines 146C in each of interconnect layers M1, M3, M5, and M7, and (ii) dummy metal vias 144C in each of interconnect layers M2, M4, and M6. The layout of dummy metal lines 146C and dummy metal vias 144C is exemplary and not limiting. The number and arrangement of dummy metal lines 146C and dummy metal vias 144C in each of interconnect layers M1-M7 can be different from the ones shown in FIGS. 1A and 1C-1D. Dummy metal lines 146C and dummy metal vias 144C are not electrically connected to power supplies and/or active devices.

In some embodiments, scribe lane region 108C can include conductive stacks 148A-148D (also referred to as "metal towers 148A-148D"), each of which are formed by a stack of dummy metal lines 146C and dummy metal vias 144C connected to each other. In some embodiments, conductive stacks 148A-148D can be separated from each other by portions of ILD layers 142 in scribe lane region 108C. In some embodiments, dummy metal lines 146C in interconnect layers M1, M3, M5, and M7 of each conductive stacks 148A-148D can be aligned to each other (not shown) or can be misaligned to each other, as shown in FIGS. 1A and 1C-1D. Adjacent dummy metal lines 146C of conductive stacks 148A-148B can be separated by distances D3-D6, as shown in FIGS. 1C-1D. In some embodiments, distances D3-D6 can be similar to or different from each other. In some embodiments, each conductive stacks 148A-148D can have a stacking arrangement of dummy metal lines 146C and dummy metal vias 144C as shown in FIG. 1E, instead of the stacking arrangement shown in FIGS. 1A and 1C-1D. The stacking arrangement of conductive stacks 148A-148D is exemplary and not limiting.

In some embodiments, scribe lane region 108C can have an array of conductive stacks 148A-148J, as shown in FIG. 1F, which illustrates a top-down view along line C-C of FIG. 1C. In some embodiments, the cross-sectional view of conductive stacks 148A-148B in FIGS. 1A and 1C-1D can be along line D-D of FIG. 1F. In some embodiments, scribe lane region 108C can include an array of control metal bars 150, as shown in FIG. 1F, for controlling the surface uniformity during a chemical mechanical polishing (CMP) process of the IC chip fabrication. In some embodiments, one row of control metal bars 150 (shown in FIG. 1F) or two rows of control metal bars 150 (shown in FIG. 1G) can be placed between adjacent rows of conductive stacks in the array of conductive stacks 148A-148B. In some embodiments, the two rows of control metal bars 150 can be spaced apart from each other by a distance D9 of about 10 nm to about 20 nm, as shown in FIG. 1G. In some embodiments, conductive stacks 148A-148J in scribe lane region 108C can be arranged as shown in FIG. 1H, instead of the arrangement of conductive stacks 148A-148J shown in FIGS. 1F-1G.

In some embodiments, conductive stacks 148A-148D along with other similar conductive stacks can be arranged in scribe lane region 108C as shown in FIGS. 1I-1J, which illustrate different top-down views along line A-A of FIG. 1A. In some embodiments, the cross-sectional view of IC chip 111 in FIGS. 1A and 1C-1D can be along line E-E of FIG. 1I or line F-F of FIG. 1J. The elements of device region 108A and seal-ring region 108B are not shown in FIGS. 1I-1J for simplicity. As shown in FIG. 1I, in some embodiments, conductive stacks 148A-148D along with other similar conductive stacks can be arranged in portions of scribe lane region 108C at the corners of IC chip 111, or can be arranged in portions of scribe lane region 108C at the corners of IC chip 111 and along sides of IC chip 111.

The number and arrangement of conductive stacks in scribe lane region 108C is exemplary and not limiting. In some embodiments, scribe lane region 108C can have any number and arrangement of conductive stacks with limitations that (i) the total surface area of scribe lane region 108C covered by the conductive stacks is greater than about 30% and less than about 50% of the total surface area of scribe lane region 108C, and (ii) distances (e.g., distances D3-D8) between adjacent dummy metal lines 146C of adjacent conductive stacks are about 40 nm to about 160 nm. In some embodiments, distances D3-D8 can be similar to or different from each other.

Within these dimension ranges, the conductive stacks of dummy metal lines 146C and dummy metal vias 144C can adequately prevent the delamination of dielectric layers or significantly reduce the delamination length in the dielectric layers without compromising the size and manufacturing cost of IC chip. Such dimension ranges provide a density of conductive stacks that can provide stress relaxation along a Z-axis for stress induced in portions of interconnect structure 131 and device layer 129 close to the corners and side edges of IC chip 111 during IC chip fabrication (e.g., during a die-singulation process). As a result, stress-induced damages along an X-axis (e.g., stress-induced delamination in the dielectric layers) can be prevented or minimized by controlling the density of dummy metal lines 146C and dummy metal vias 144C.

If the conductive stacks cover greater than about 50% of the total surface area of scribe lane region 108C and/or distances (e.g., distances D3-D8) between adjacent dummy metal lines 146C of adjacent conductive stacks are less than about 40 nm, the lateral propagation of stress-induced delamination in the dielectric layers is not prevented or minimized due to the high density of conductive stacks, which prevents stress relaxation along a Z-axis. On the other hand, if the conductive stacks cover less than about 30% of the total surface area of scribe lane region 108C and/or distances (e.g., distances D3-D8) between adjacent dummy metal lines 146C of adjacent conductive stacks are greater than about 160 nm, surface non-uniformity across different regions of IC chip 111 increases during a CMP process of the IC chip fabrication.

Figure 1K:
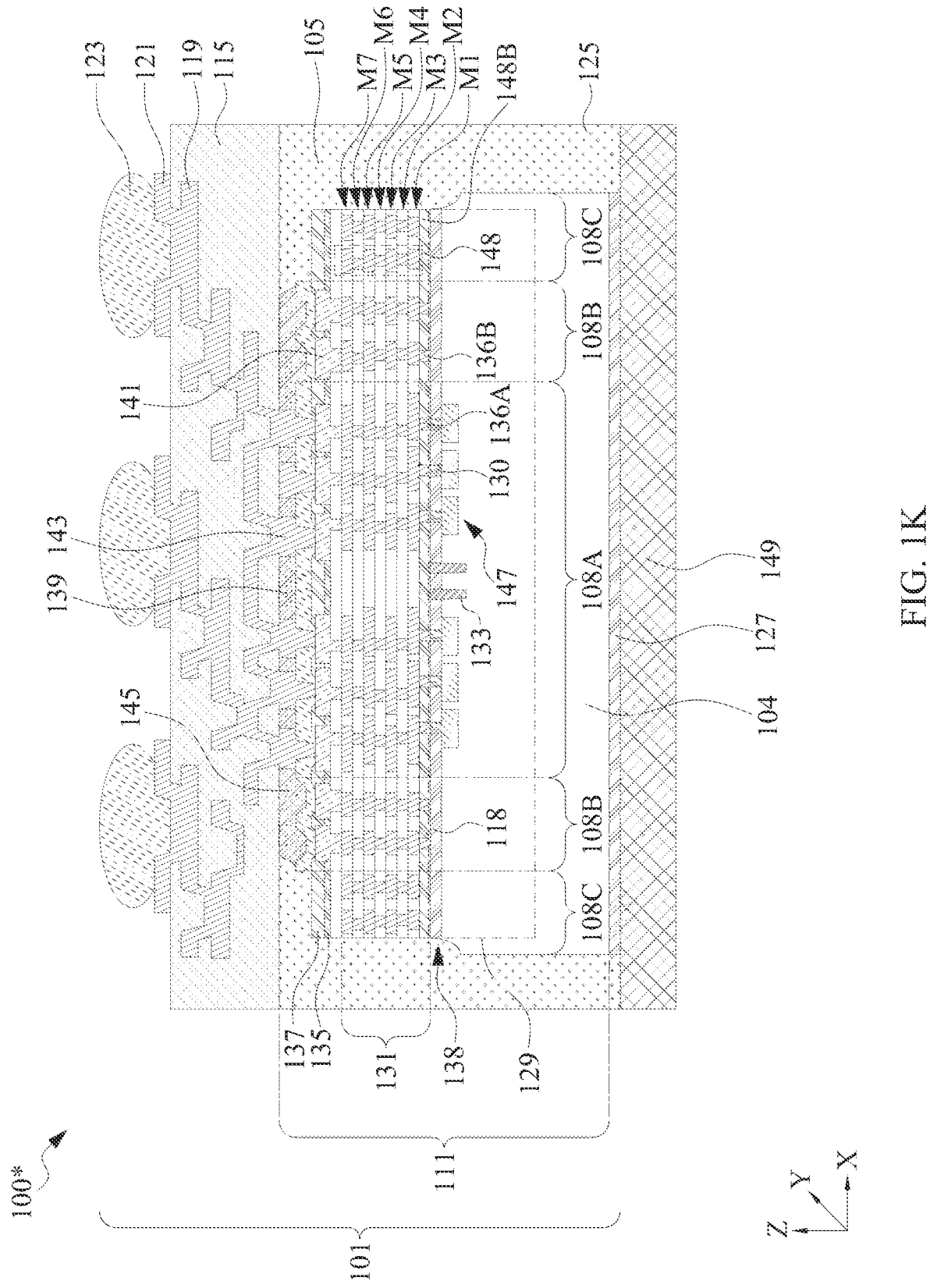
FIGS. 1K-1L illustrate cross-sectional views of IC chip packages, in accordance with some embodiments.

FIG. 1K illustrates a cross-sectional view of an IC chip package 100*, according to some embodiments. The discussion of elements in FIGS. 1A-1J with the same annotations applies to each other, unless mentioned otherwise. IC chip package 100* can have an InFO package structure, similar to IC chip package 100, but IC chip package 100* does not have a PoP structure. In some embodiments, IC chip 111 of IC chip package 100* can be disposed on a semiconductor substrate 149, instead of on another IC chip package.

Figure 1L:
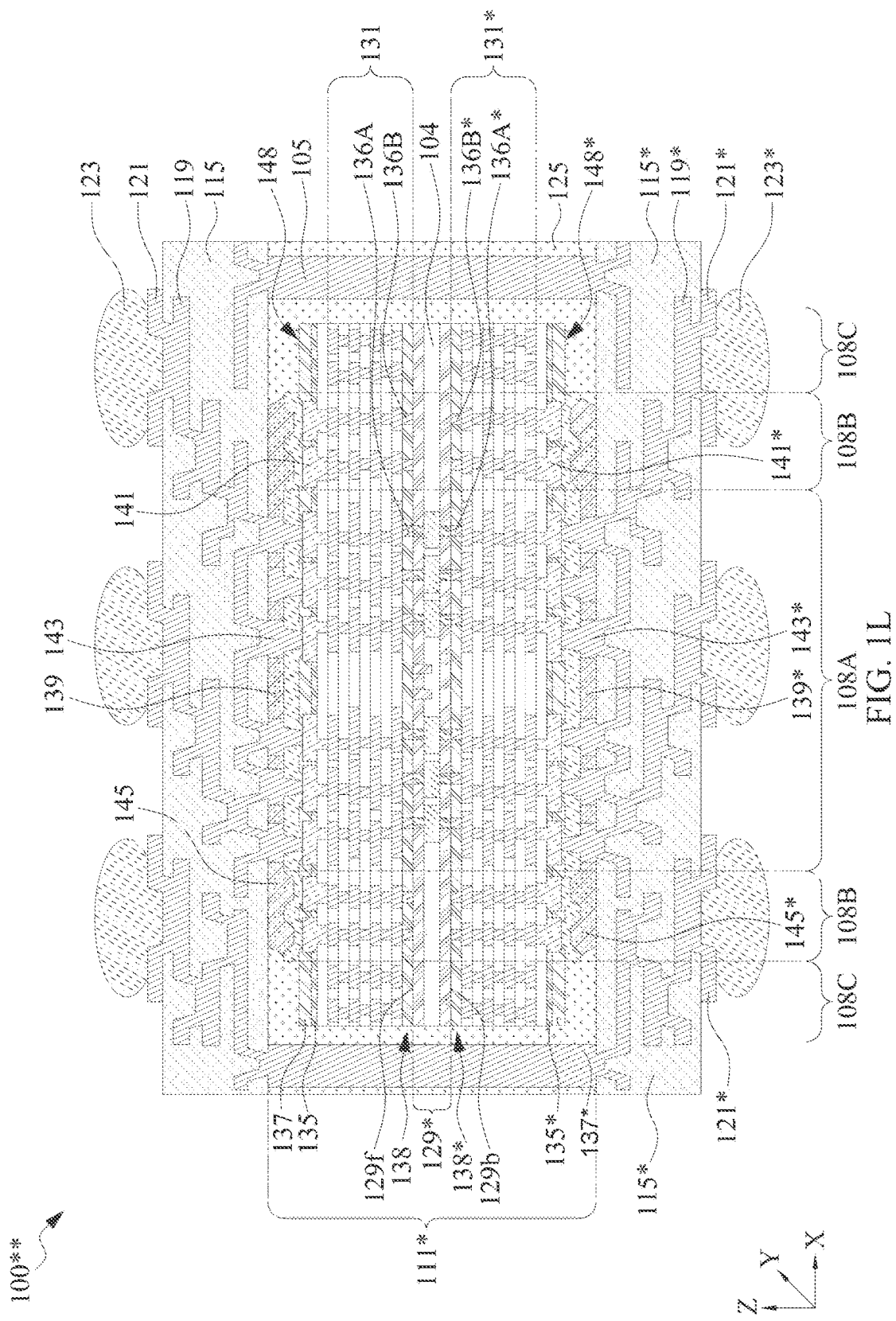

FIG. 1L illustrates a cross-sectional view of an IC chip package 100, according to some embodiments. The discussion of elements in FIGS. 1A-1J with the same annotations applies to each other, unless mentioned otherwise. IC chip package 100** can have an InFO package structure, but IC chip package 100** does not have a PoP structure. Unlike IC chip package 100, IC chip package 100** can include backside RDLs 119* in backside dielectric layer 115* and backside conductive bonding structures 123* disposed on backside contact pads 121* The discussion of RDLs 119, dielectric layer 115, conductive bonding structures 123, and contact pads 121 applies to backside RDLs 119*, backside dielectric layer 115*, backside conductive bonding structures 123*, and backside contact pads 121***, respectively, unless mentioned otherwise.

In some embodiments, IC chip 111* can have a device layer 129*. The discussion of device layer 129 applies to device layer 129*, unless mentioned otherwise. In some embodiments, the structures disposed on front side surface 129f of device layer 129* are similar to structures disposed in device layer 129. Unlike IC chip 111, IC chip 111* can include (i) a backside via layer 138* disposed on backside surface 129b of device layer 129*, (ii) a backside interconnect structure 131* disposed on backside via layer 138*, (iii) a backside oxide layer 135* disposed on backside interconnect structure 131*, (iv) a backside nitride layer 137* disposed on backside oxide layer 135*, (v), backside conductive pads 141* disposed on portions of backside interconnect structure 131* in device region 108A and seal-ring region 108B, (vi) a backside polymer layer 139* disposed on backside conductive pads 141* and on portions of backside nitride layer 137* in device region 108A and seal-ring region 108B, (vii) backside conductive vias 143* disposed on backside conductive pads 141* in device region 108A, and (viii) a backside stress buffer layer 145* disposed on backside polymer layer 139* The discussion of via layer 138, interconnect structure 131, oxide layer 135, nitride layer 137, conductive pads 141, polymer layer 139, conductive vias 143, and stress buffer layer 145 applies to backside via layer 138*, backside interconnect structure 131*, backside oxide layer 135*, backside nitride layer 137*, backside conductive pads 141*, backside polymer layer 139*, backside conductive vias 143*, and backside stress buffer layer 145*, respectively, unless mentioned otherwise. In some embodiments, the number and arrangement of lines and vias in interconnect structures 131 and 131* can be similar to or different from each other.

Figure 2:
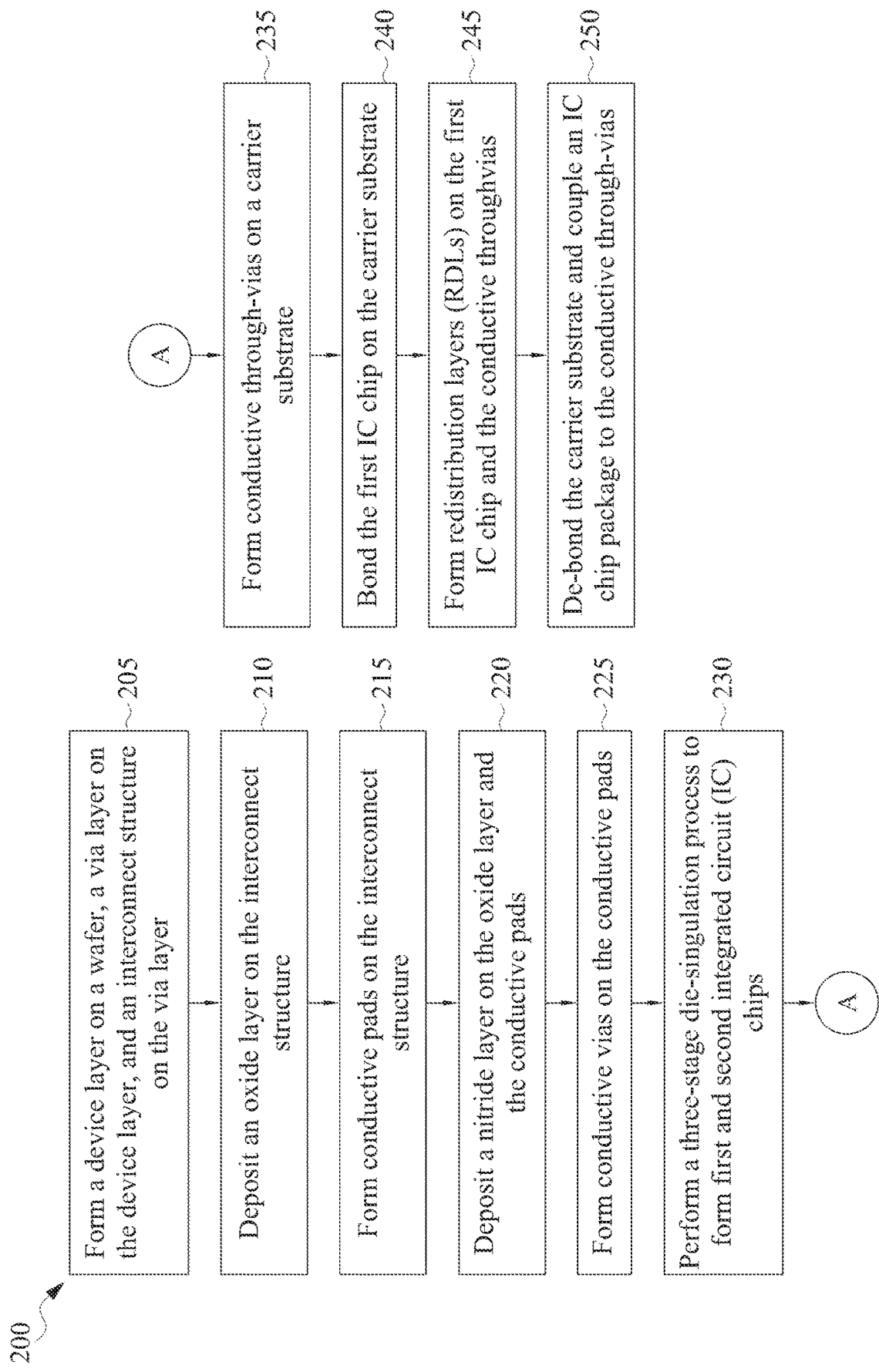
FIG. 2 is a flow diagram of a method for fabricating an IC chip package, in accordance with some embodiments.

FIG. 2 is a flow diagram of an example method 200 for IC chip package 100, according to some embodiments. For illustrative purposes, the operations illustrated in FIG. 2 will be described with reference to the example fabrication process for fabricating IC chip package 100 as illustrated in FIGS. 3-17. FIGS. 3-17 are cross-sectional views of IC chip package 100 at various stages of fabrication, according to some embodiments. Operations can be performed in a different order or not performed depending on specific applications. It should be noted that method 200 may not produce a complete IC chip package 100. Accordingly, it is understood that additional processes can be provided before, during, and after method 200, and that some other processes may only be briefly described herein. Elements in FIGS. 3-17 with the same annotations as elements in FIGS. 1A-1D are described above.

Figure 3:
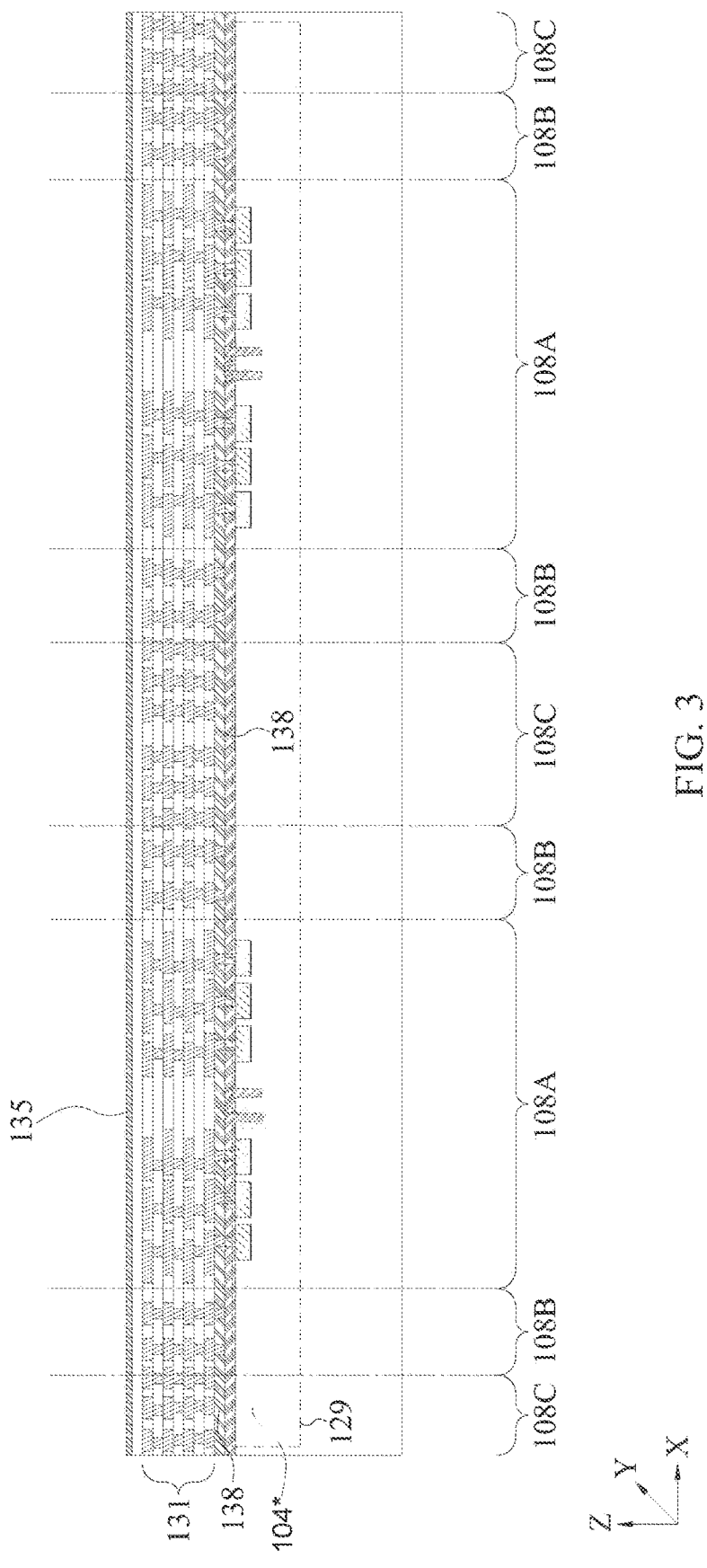

Referring to FIG. 2, in operation 205, a device layer is formed on a wafer, a via layer is formed on the device layer, and an interconnect structure is formed on the via layer. For example, as shown in FIG. 3, device layer 129 is formed on wafer 104*, via layer 138 is formed on device layer 129, and interconnect structure 131 is formed on via layer 138. In some embodiments, semiconductor devices, such as GAA FETs, finFETs, and MOSFETs can be formed in device layer 129. Though FIG. 3 shows two dies 311 and 311*, wafer 104* can have any number of dies.

Referring to FIG. 2, in operation 210, an oxide layer is deposited on the interconnect structure. For example, as shown in FIG. 3, oxide layer 135 is deposited on interconnect structure 131. In some embodiments, the deposition of oxide layer 135 can include depositing a layer of silicon oxide or another suitable insulating oxide material on interconnect structure 131 to form the structure of FIG. 3.

Figure 4:
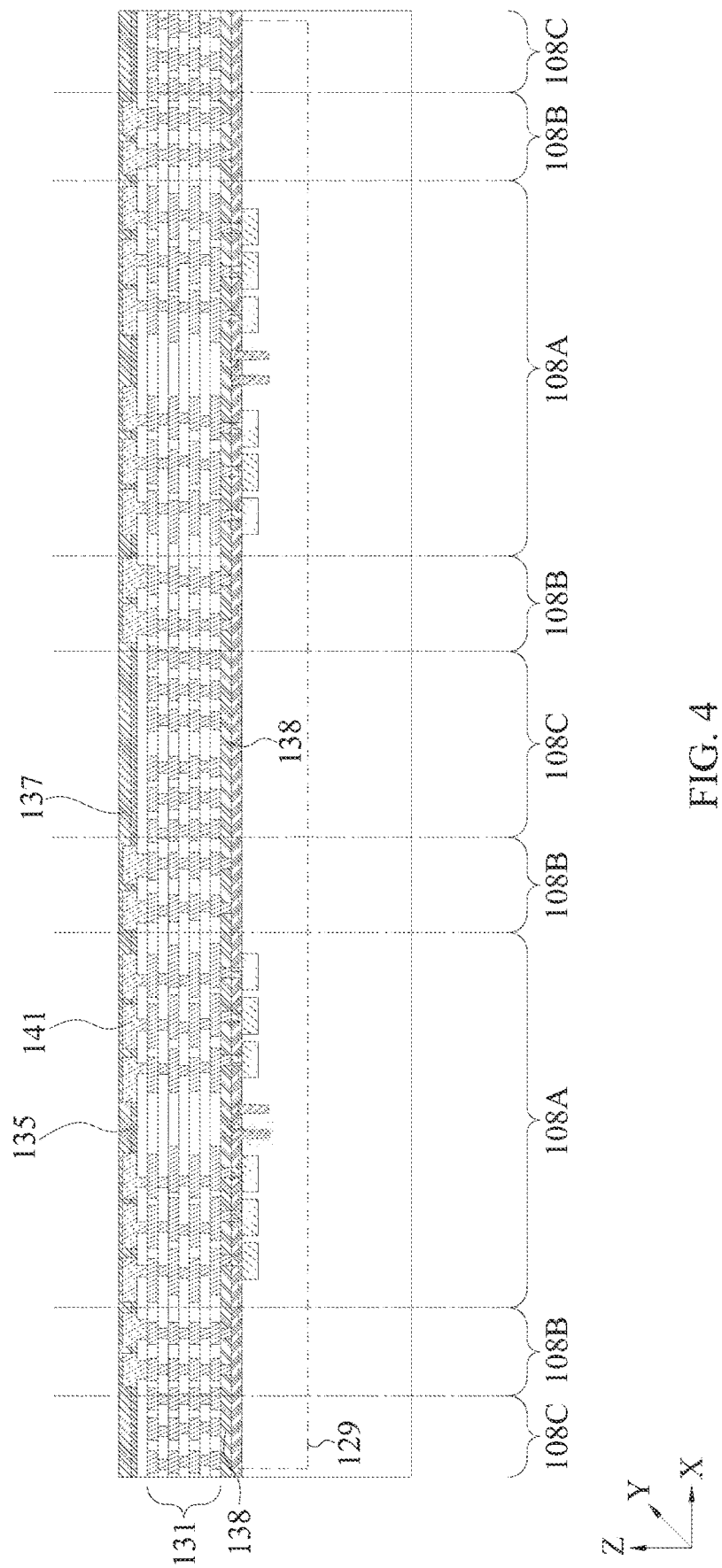

Referring to FIG. 2, in operation 215, conductive pads are formed on the interconnect structure. For example, as shown in FIG. 4, conductive landing pads 141 are formed on interconnect structure 131. The formation of conductive landing pads 141 can include sequential operations of: (i) forming openings (not shown) in oxide layer 135 to expose top surfaces of interconnect structure 131 by selectively removing portions of oxide layer 135 with a lithographic process and an etching process, (ii) depositing a metal layer (not shown) in the openings, and (iii) selectively removing portions of the metal layer with a lithographic process and an etching process.

Referring to FIG. 2, in operation 220, a nitride layer is deposited on the oxide layer and the conductive pads. For example, as shown in FIG. 4, nitride layer 137 is deposited on oxide layer 135 and conductive pads 141. In some embodiments, the deposition of nitride layer 137 can include depositing a layer of silicon nitride or another suitable insulating nitride material on oxide layer 135 and conductive pads 141 to form the structure of FIG. 4.

Figure 5:
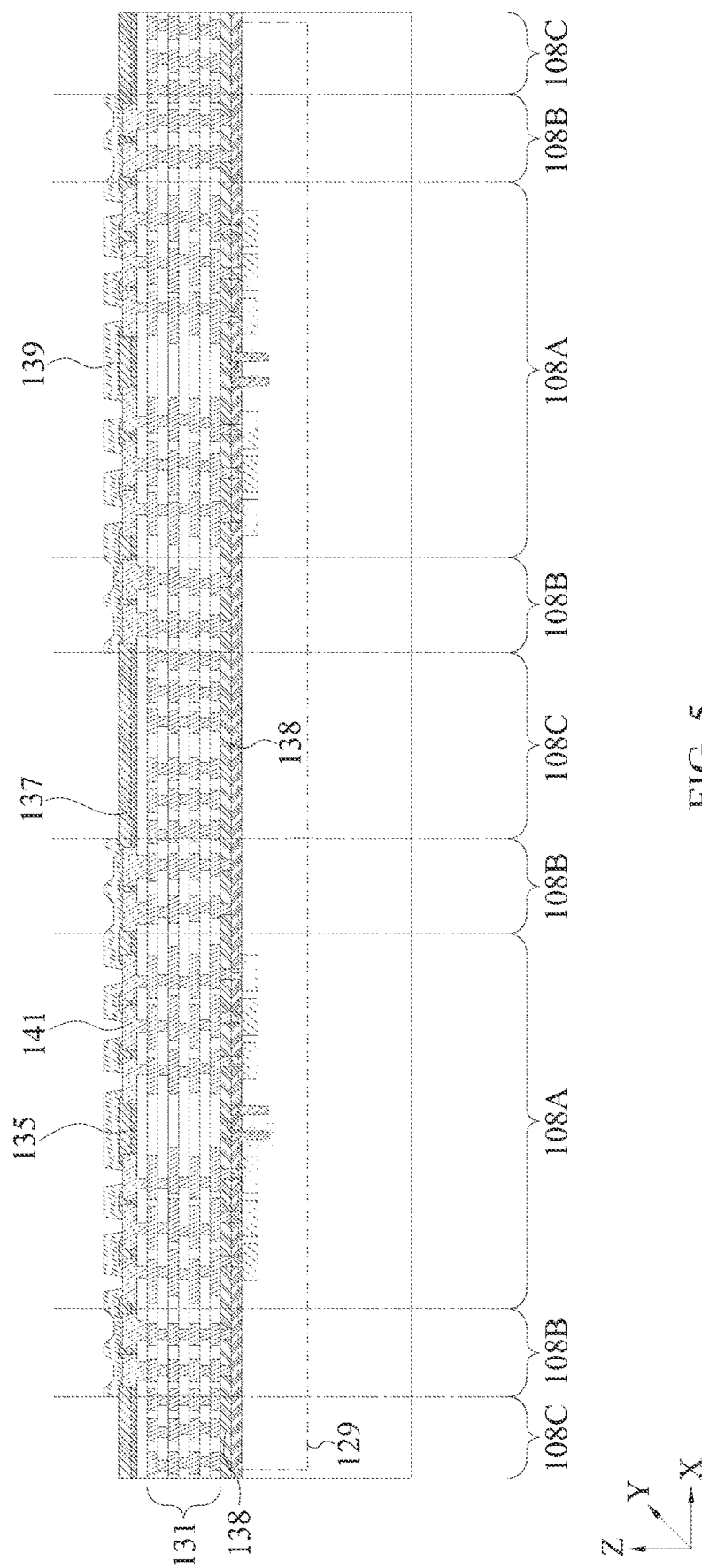
Figure 6:
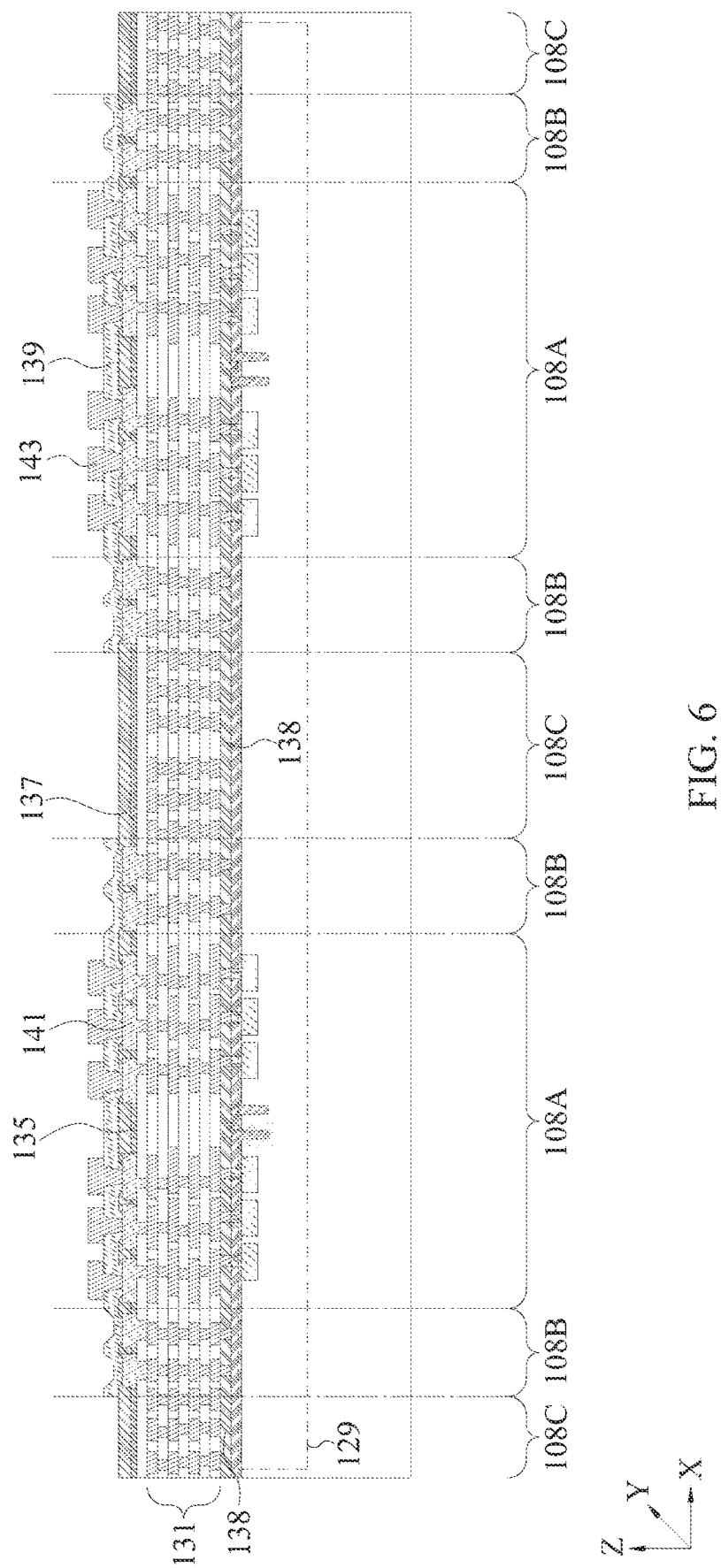

Referring to FIG. 2, in operation 225, conductive vias are formed on the conductive pads. For example, as described with reference to FIGS. 5-6, conductive vias 143 are formed on conductive pads 141. The formation of conductive vias 143 can include sequential operations of: (i) etching portions of nitride layer 137 to expose top surfaces of conductive landing pads 141, (ii) forming polymer layer 139, as shown in FIG. 5, (iii) depositing a metal layer (not shown) on the structure of FIG. 5, and (iv) selectively removing portions of the metal layer with a lithographic process and an etching process to form the structure of FIG. 6.

Referring to FIG. 2, in operation 230, a three-stage die-singulation process is performed to form first and second IC chips. For example, as described with reference to FIGS. 7-10, a three-stage die-singulation process is performed to form first IC chip 111 and a second IC chip 111*.

Figure 7:
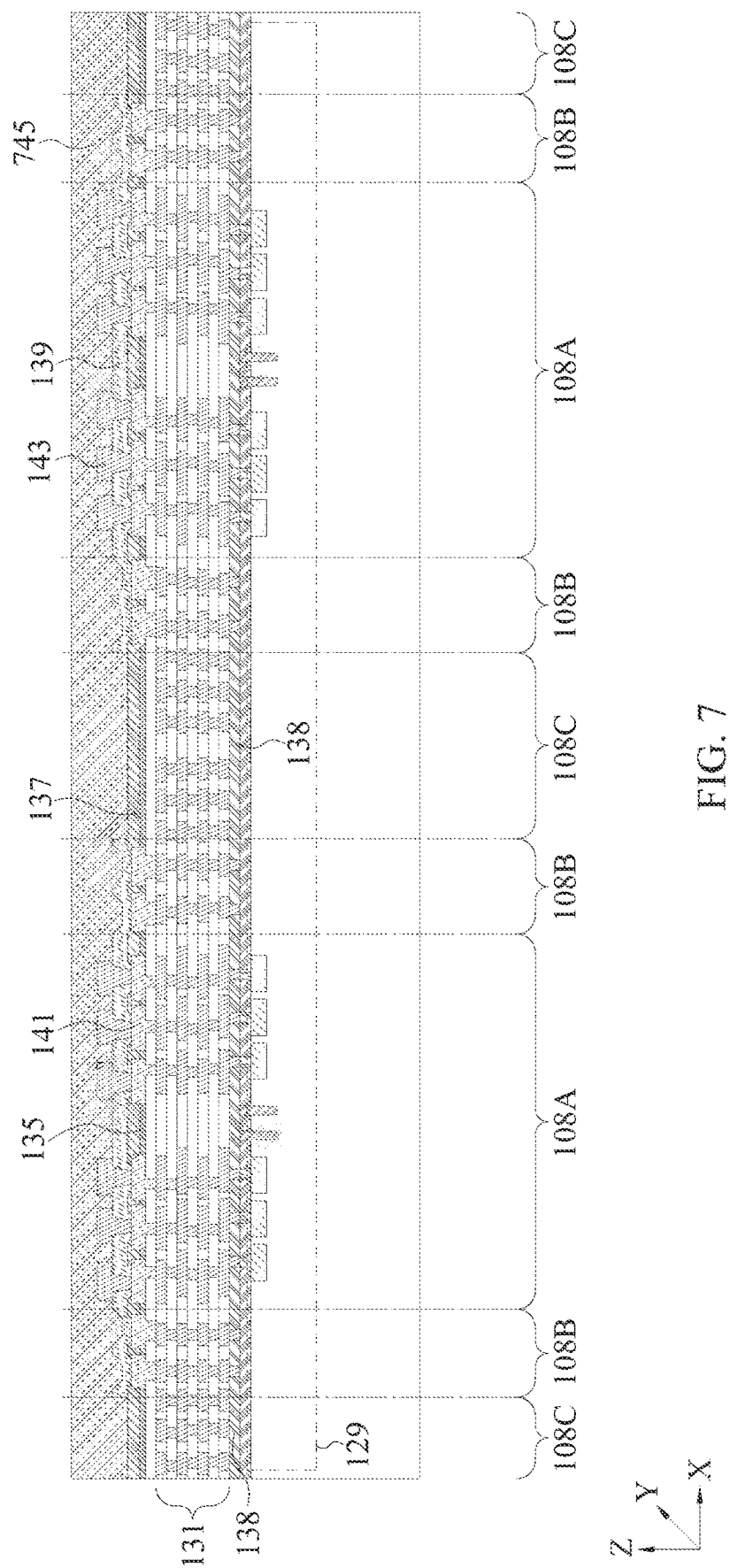
Figure 8:
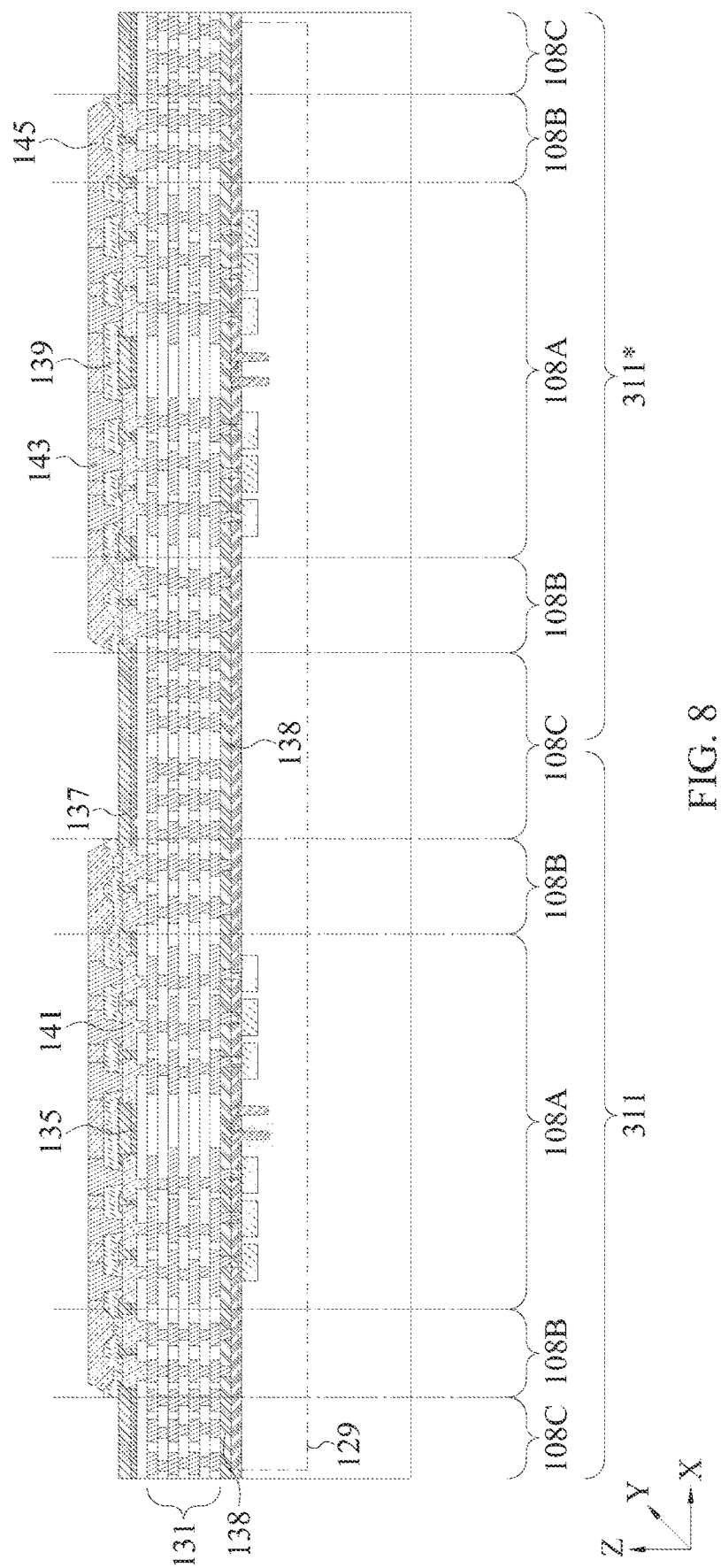

In some embodiments, the first stage of the die-singulation process can include forming stress buffer layers 145 on each of dies 311 and 311*, as shown in FIG. 8. The formation of stress buffer layers 145 can include sequential operations of: (i) depositing a photosensitive material layer 745 on the structure of FIG. 6, as shown in FIG. 7, (ii) patterning photosensitive material layer 745 with a photolithographic process to form the tapered structure of stress buffer layers 145, as shown in FIG. 8, and (iii) performing a curing process on stress buffer layers 145 of FIG. 8. In some embodiments, photosensitive material layer 745 can include a polymer material and the curing process can toughen or harden the polymer material by cross-linking polymer chains of the polymer material. In some embodiments, the curing process can be performed at a temperature of about 250° C. to about 400° C. for a duration of about 1 hour to about 4 hours. The first stage of the die-singulation process can be followed by a wafer thinning process.

Figure 9:
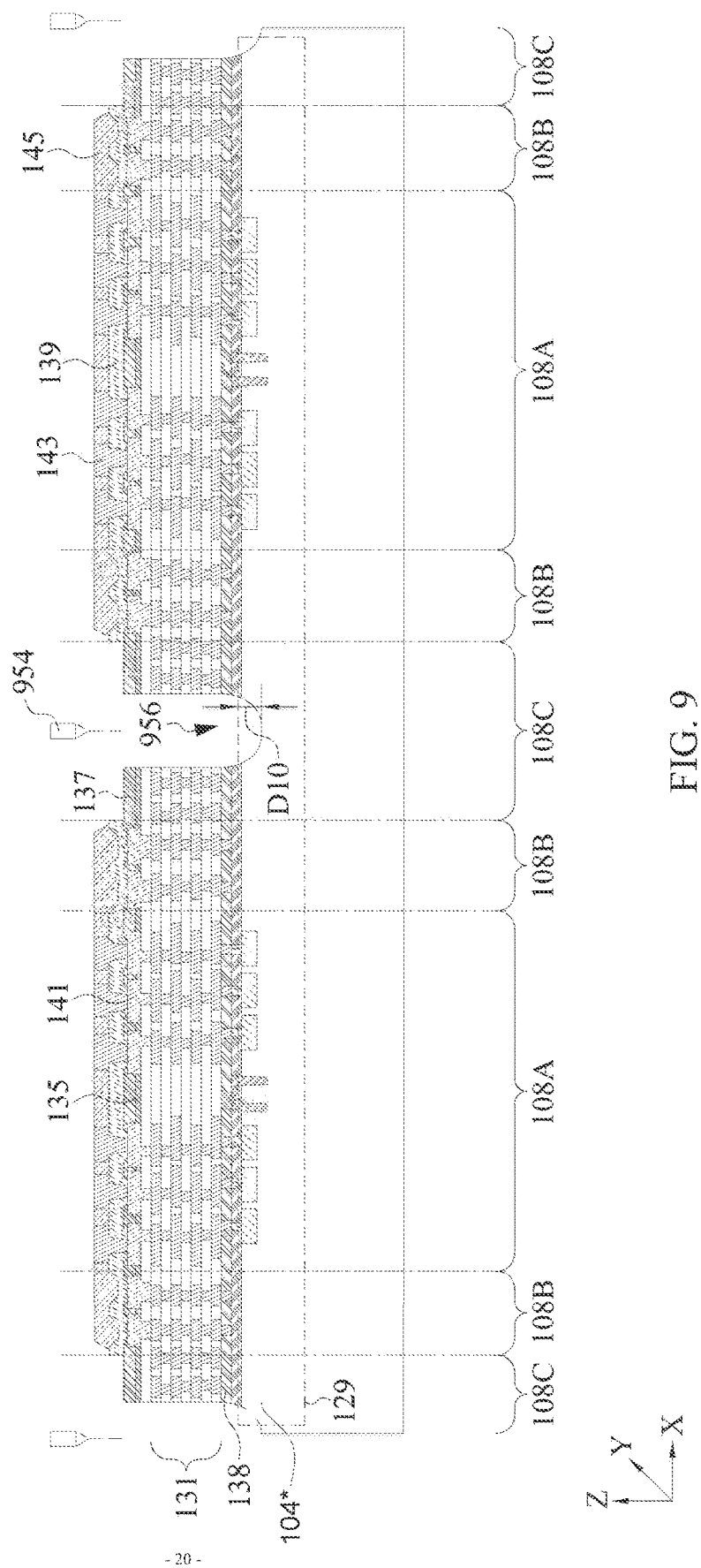

In some embodiments, the second stage of the die-singulation process can include forming trenches 956 along scribe lanes in scribe lane region 108C, as shown in FIG. 9. The formation of trenches 956 can include removing portions of nitride layer 137, oxide layer 135, interconnect structure 131, via layer 138, device layer 129, and wafer 104* in scribe lane region 108C with a laser grooving process. In some embodiments, trenches 956 extend a distance D10 of about 1 μm to about 5 μm into wafer 104* to reduce or prevent stress induced on nitride layer 137, oxide layer 135, interconnect structure 131, via layer 138, and device layer 129 during a wafer saw process used in the third stage of the die-singulation process.

In some embodiments, the laser grooving process can include using a laser 954 with a power density of about 0.4 J/mm² to about 1.2 J/mm² and a wavelength of about 300 nm to about 500 nm. This laser power density is about 30% to about 50% lower than that used in a laser grooving process of a two-stage die-singulation process. In the two-stage die-singulation process, stress buffer layers are not removed from the scribe lane region with a lithographic process prior to using the laser grooving process. Instead, the stress buffer layers along with the oxide layer, nitride layer, interconnect structure, device layer, and wafer are removed from the scribe lane region to form trenches using a laser grooving process. As a result, a higher laser power density is required in the laser grooving process of the two-stage die-singulation process. With the use of a lower laser power density during the second stage of the die-singulation process, thermal damages, such as delamination of nitride layer 137, oxide layer 135, ILD layers 142 of interconnect structure 131, and formation of voids in interconnect structure 131 and conductive vias 143 can be substantially reduced or eliminated.

Figure 10:
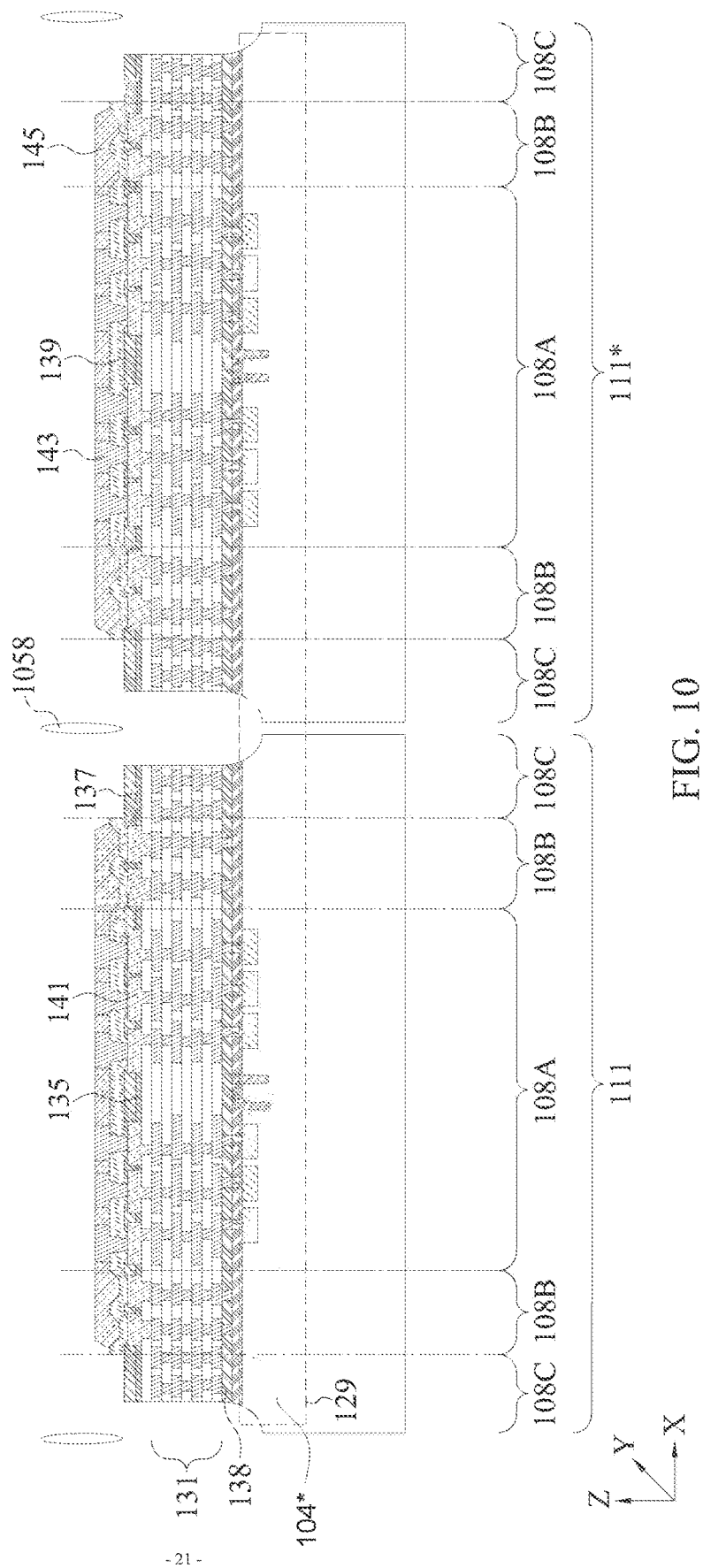
Figure 11:
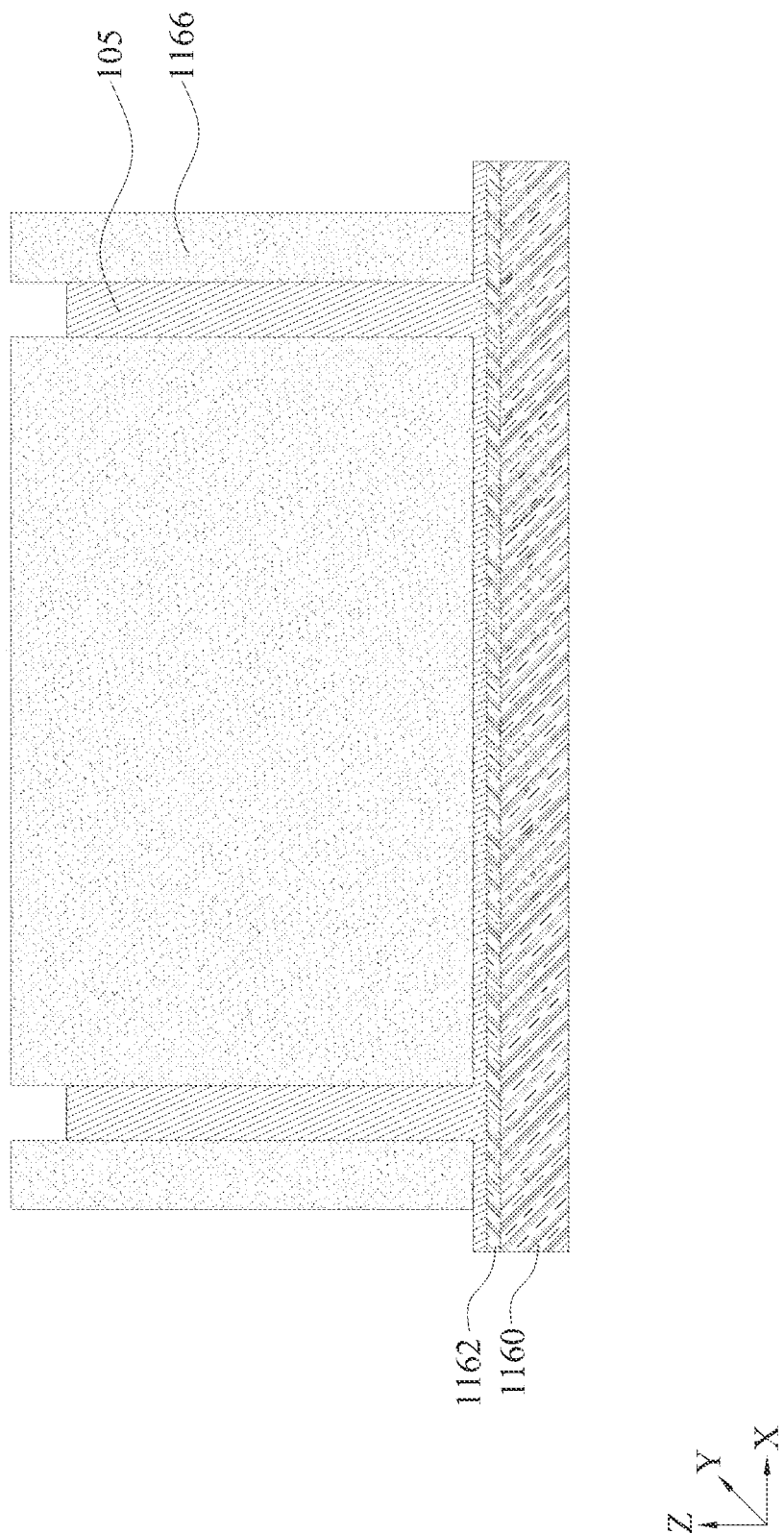
Figure 12:
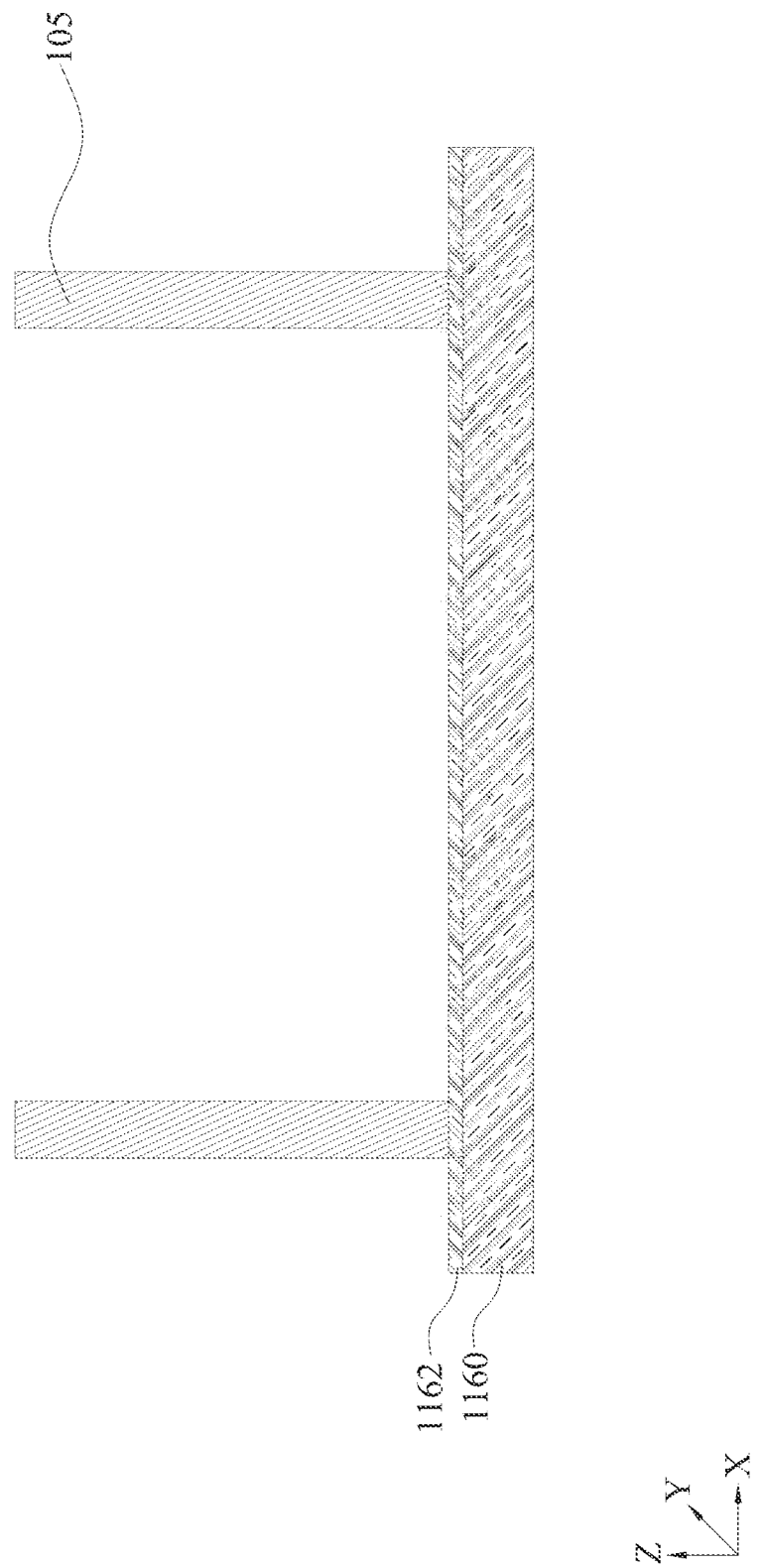

In some embodiments, the third stage of the die-singulation process can include separating dies 311 and 311* from each other to form IC chips 111 and 111*, as shown in FIG. 10. In some embodiments, the separation of dies 311 and 311* can include sawing wafer 104* through trenches 956 using a mechanical saw 1058.

Figure 11:
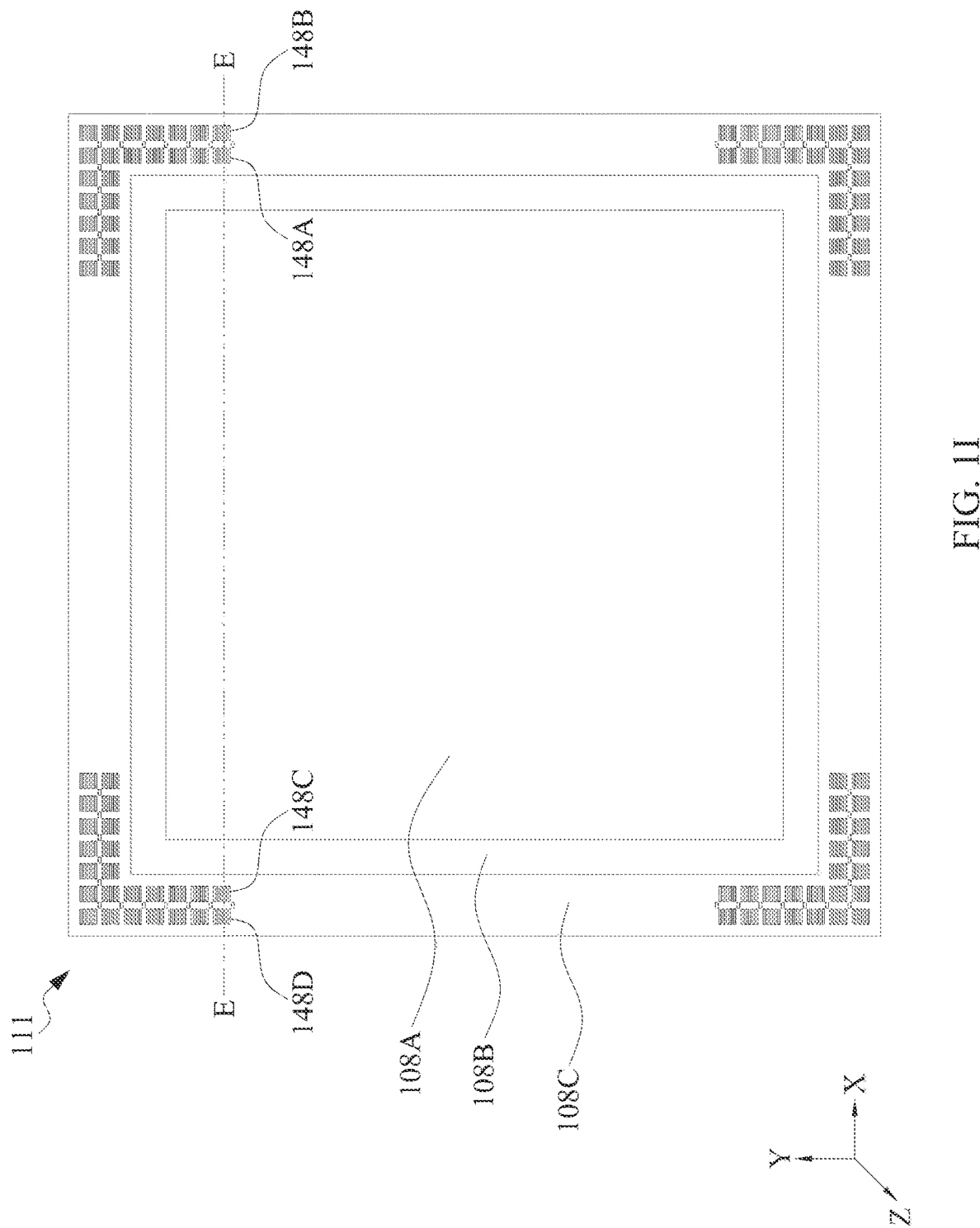
FIGS. 3-17 illustrate cross-sectional views of an IC chip package at various stages of its fabrication process, in accordance with some embodiments.

Referring to FIG. 2, in operation 235, conductive through-vias are formed on a carrier substrate. For example, as described with reference to FIGS. 11-12, conductive through-vias 105 are formed on a carrier substrate 1160. The formation of conductive through-vias 105 can include sequential operations of: (i) depositing a de-bond layer 1162 on carrier substrate 1160, as shown in FIG. 11, (ii) forming a patterned photoresist layer 1166 with openings (not shown), (iii) depositing a metal layer of conductive through-vias 105 in the openings to form the structure of FIG. 11, and (iv) removing patterned photoresist layer 1166 to form the structure of FIG. 12.

Figure 13:
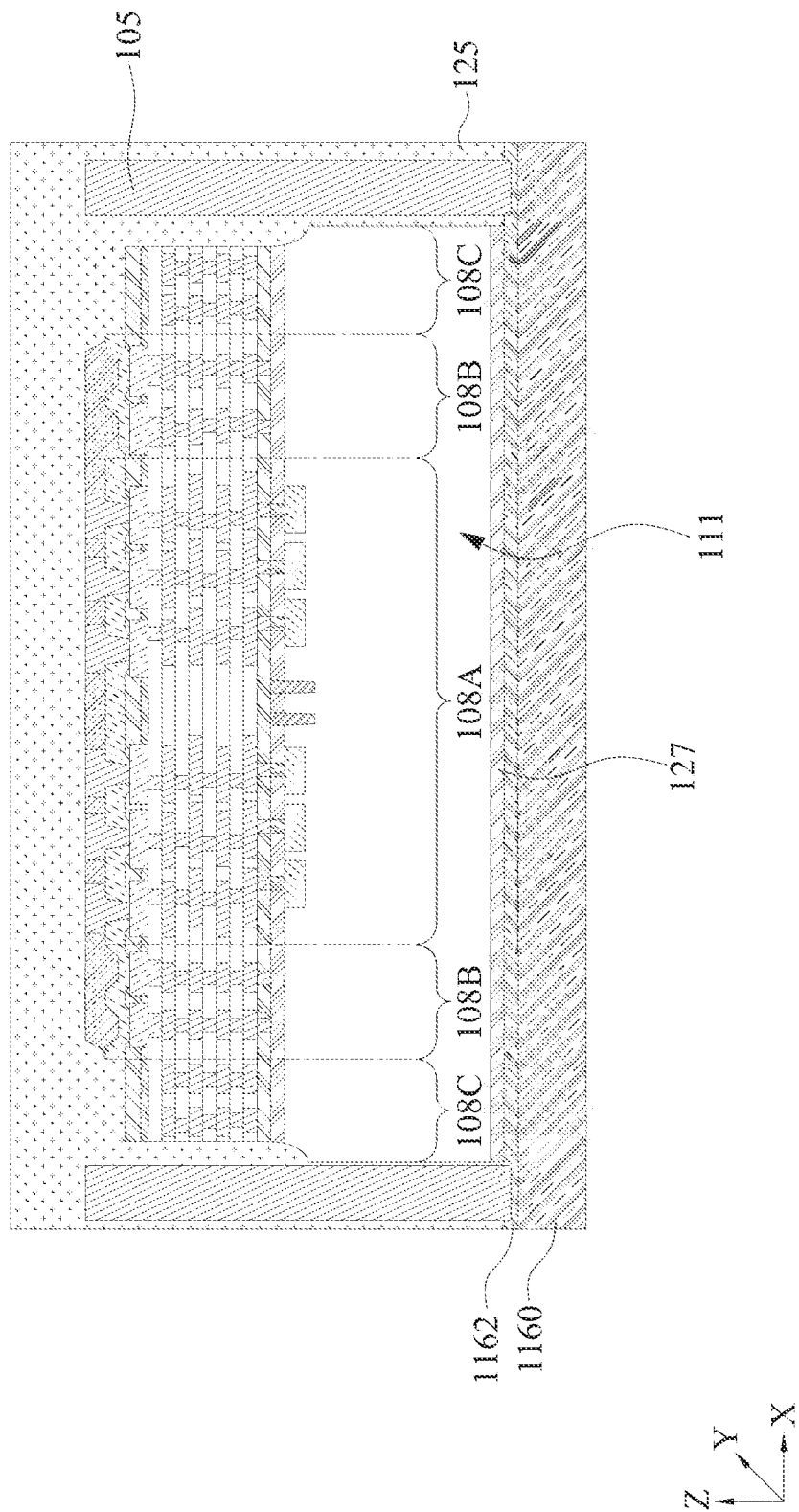
Figure 14:
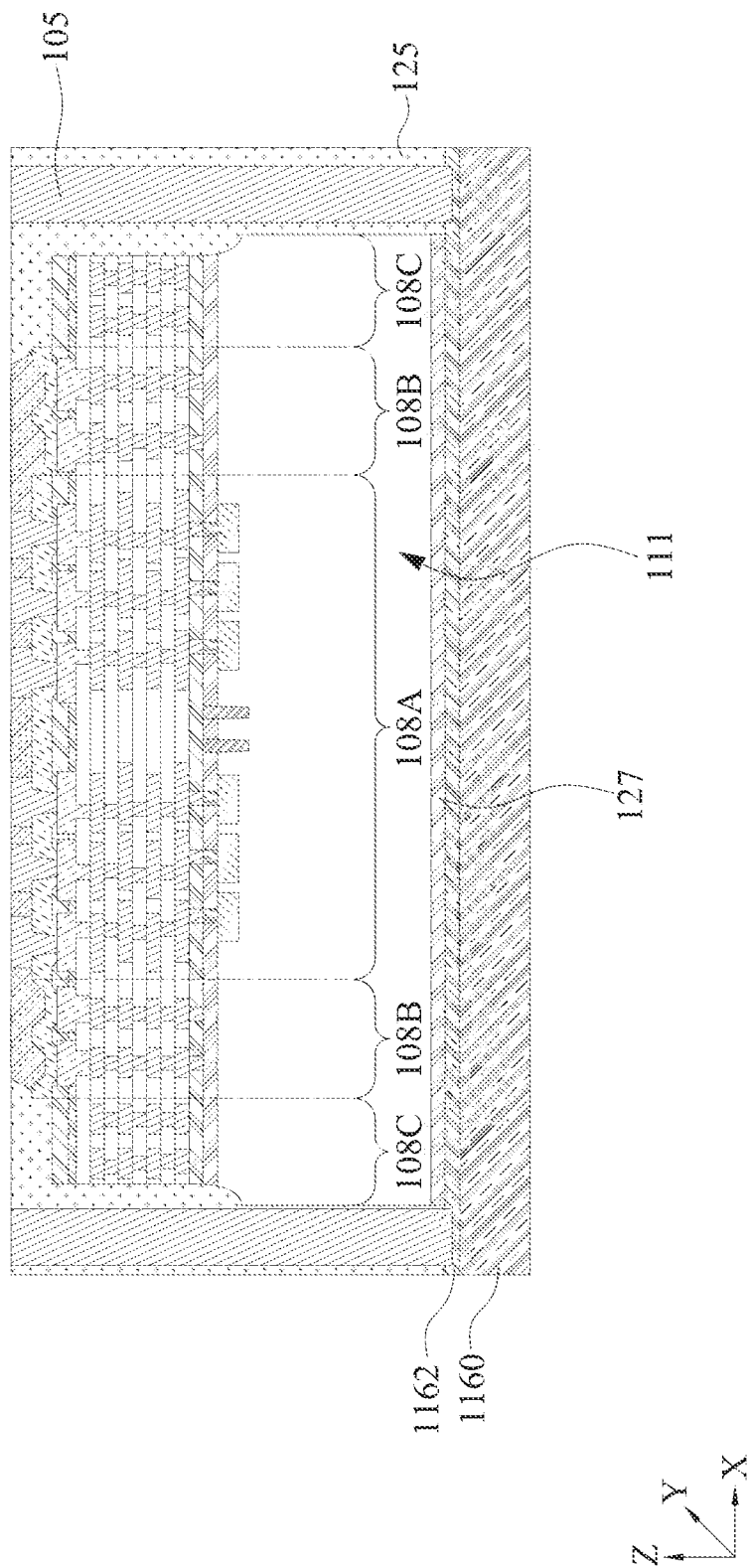

Referring to FIG. 2, in operation 240, the first IC chip is bonded to the carrier substrate. For example, as shown in FIG. 13, first IC chip 111 is bonded to carrier substrate 1160 with a die attach film 127. The bonding of first IC chip 111 can be followed by depositing molding layer 125 to encapsulate first IC chip 111 and conductive through-vias 105 to form the structure of FIG. 13. The deposition of molding layer 125 can be followed by a grinding process or a CMP process to substantially planarize top surfaces of stress buffer layer 145 and molding layer 125 and expose top surfaces of conductive vias 143, as shown in FIG. 14.

Figure 15:
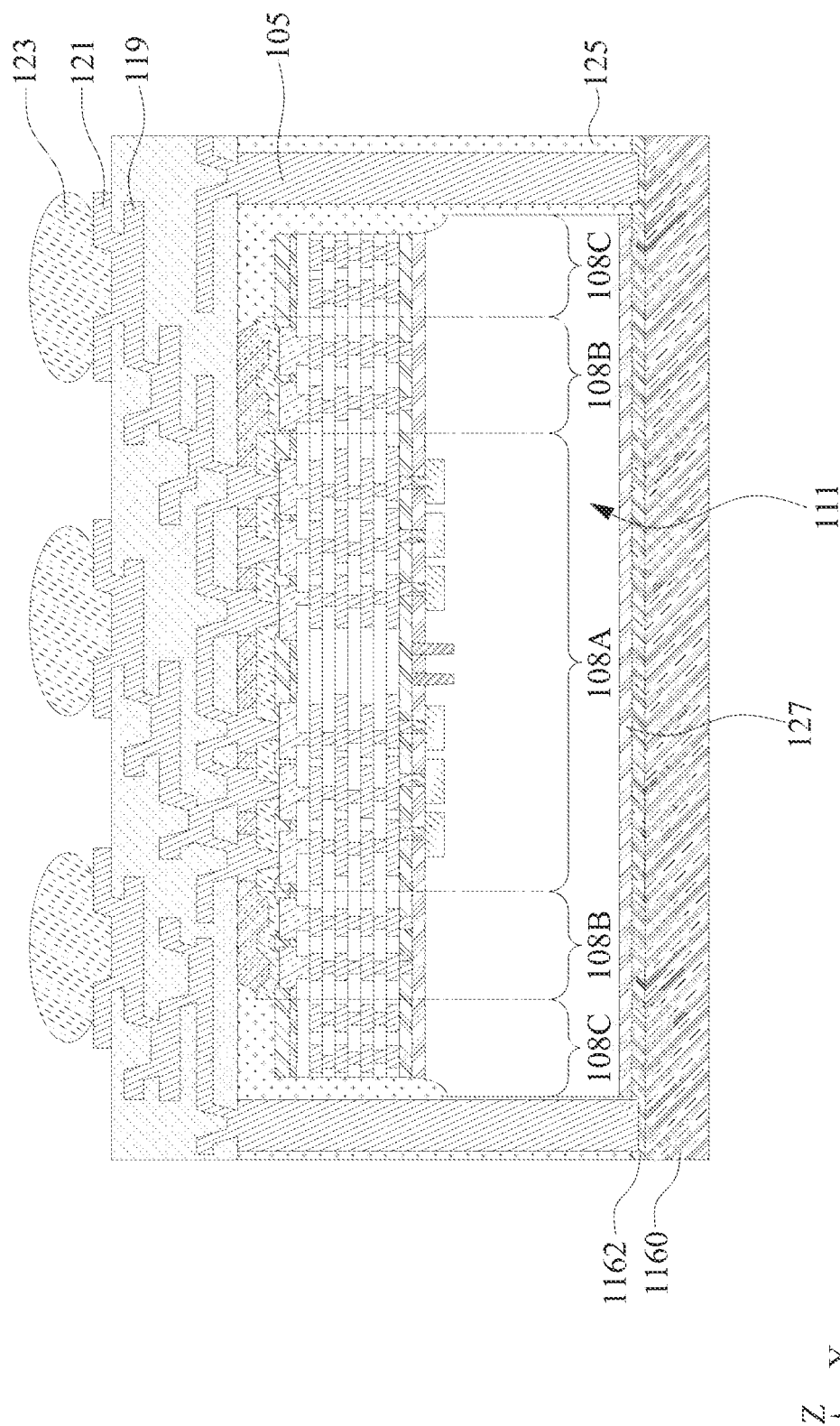
Figure 16:
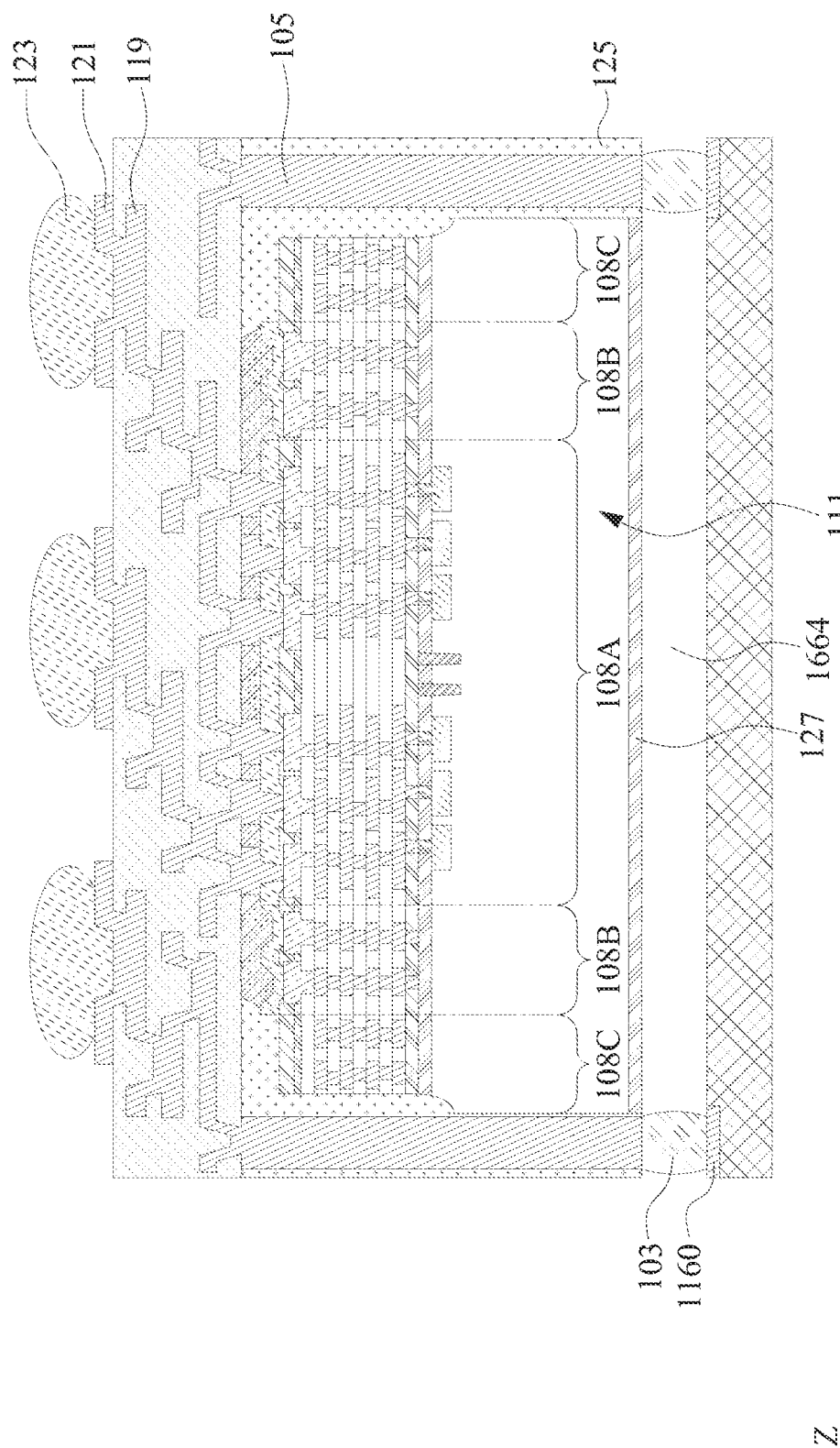

Referring to FIG. 2, in operation 245, redistribution layers are formed on the first IC chip and the conductive through-vias. For example, as shown in FIG. 15, RDLs 119 within dielectric layer 115 are formed on first IC chip 111 and conductive through-vias 105. The formation of RDLs 119 can be followed by the formation metal contact pads 121 and conductive bonding structures 123, as shown in FIG. 15.

Figure 17:
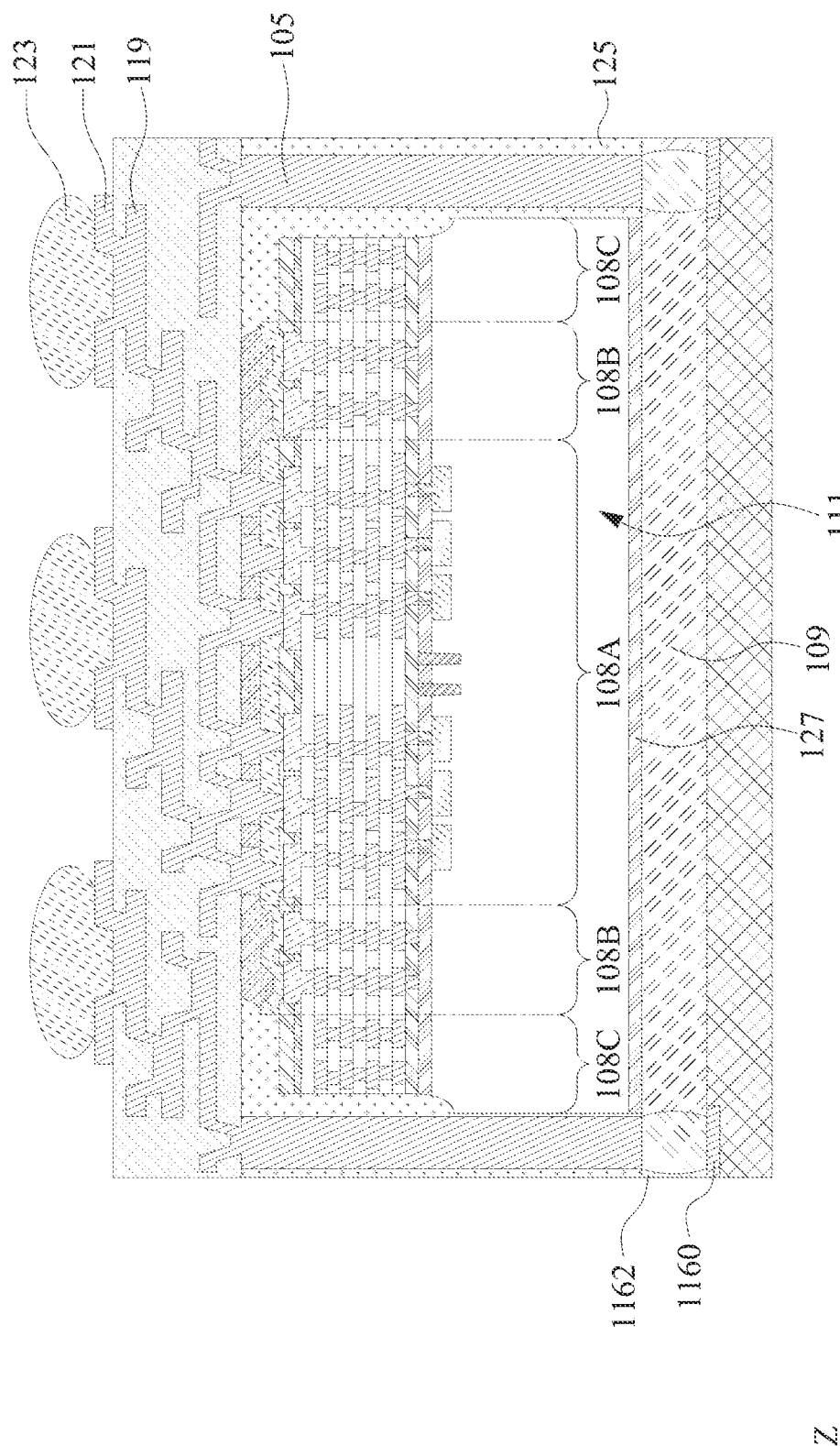

Referring to FIG. 2, in operation 250, the carrier substrate is de-bonded and an IC chip package is coupled to the conductive through-vias. For example, as described with reference to FIGS. 16-17, carrier substrate 1160 is de-bonded from first IC chip 111 and second IC chip package 102 is electrically coupled to conductive through-vias 105 with inter-package connectors 103. The coupling of second IC chip package can be followed by filling region 1664 (shown in FIG. 16) between first IC chip package 101 and second IC chip package 102 with the material of sealing layer 109, as shown in FIG. 17.

The present disclosure provides example structures of IC chip packages (e.g., IC chip packages 100, 100*, or 100**) and example methods of fabricating the same to reduce or prevent delamination of dielectric layers in IC chips and consequently improve IC chip reliability for higher IC chip performance. In some embodiments, the IC chip packages can include one or more IC chips (e.g., IC chip 111), which can include a device region (e.g., device region 108A), a seal-ring region (e.g., seal-ring region 108B) surrounding the device region, and a scribe lane region (e.g., scribe lane region 108C) surrounding the seal-ring region. In some embodiments, the device region can include a device layer (e.g., device layer 129) disposed on a substrate, a via layer (e.g., via layer 138) disposed on the device layer, an interconnect structure (e.g., interconnect structure 131) disposed on the via layer, passivation layers (e.g., oxide layer 135 and nitride layer 137) disposed on the interconnect structure, and a stress buffer layer (e.g., stress buffer layer 145) disposed on the passivation layers. In some embodiments, a portion of the device layer in the device region can include electrically active semiconductor devices (e.g., GAA FETs, finFETs, or MOSFETs). In some embodiments, portions of the device layer in the seal-ring region and the scribe lane region do not include semiconductor devices. In some embodiments, the portion of the device layer in the scribe lane region can include test structures and/or electrically inactive ("dummy") semiconductor devices.

In some embodiments, a portion of the interconnect structure in the device region can include an electrically conductive structure of conductive lines and conductive vias that can be connected to power supplies and/or electrically active devices. In some embodiments, a portion of the interconnect structure in the seal-ring region can include a SR metal structure, and a portion of the interconnect structure in the scribe lane region can include a SL metal structure. The SR metal structure and the SL metal structure can include dummy metal lines (e.g., dummy metal lines 146B and 146C) and dummy metal vias (e.g., dummy metal vias 144B and 144C) that are not connected to power supplies or electrically active devices.

In some embodiments, the SR metal structure physically connected to metal vias (e.g., vias 136B) in the via layer. The physical connection of the SR metal structure with the metal vias can prevent or reduce the delamination of dielectric layers in the interconnect structure and in the device layer. In some embodiments, the number of metal vias in the via layer physically connected to the SR metal structure is greater than 10 and the width of each metal via is about 20 nm to about 60 nm for adequately preventing the delamination of dielectric layers or for reducing the delamination length in the dielectric layers.

In some embodiments, the SL metal structure can include an array of conductive stacks (e.g., conductive stacks 148A-148J), each of which can include a stack dummy metal lines (e.g., dummy metal lines 146C) and dummy metal vias (e.g., dummy metal vias 144C) in various configurations. Based on the arrangement of the conductive stacks in the scribe lane region, the delamination of dielectric layers in the interconnect structure and in the device layer can be prevented or reduced. In some embodiments, the conductive stacks can be arranged in the scribe lane region (i) to have a distance of about 40 nm to about 160 nm between adjacent conductive stacks, and (ii) to cover less than or equal to about 50% (e.g., about 30% to about 50%) of the total surface area of the scribe lane region for adequately preventing the delamination of dielectric layers or for reducing the delamination length in the dielectric layers.

In some embodiments, by (i) physically connecting the SR metal structure to more than 10 metal vias in the via layer, (ii) spacing the conductive stacks of the SL metal structure with a distance of about 40 nm to about 160 nm from each other, and/or (iii) arranging the conductive stacks to cover less than or equal to about 50% of the total surface area of the scribe lane region, the delamination length in the dielectric layers can be reduced by about 80% to about 90% (e.g., can be reduced from about 7 μm to less than about 1 μm) compared to IC chips without the above described configurations of the SR metal structure and the SL metal structure.

In some embodiments, a structure includes a substrate with a first region, a second region surrounding the first region, and a third region surrounding the second region, a device layer disposed on the substrate, a via layer disposed on the device layer, an interconnect structure disposed on the via layer, and a stress buffer layer with tapered side profiles disposed on the first and second portions of the interconnect structure. A portion of the device layer above the first region includes devices, A first portion of the via layer above the first region includes a first set of vias and a second portion of the via layer above the second region includes a second set of vias. A first portion of the interconnect structure above the first region includes conductive lines connected to the devices, a second portion of the interconnect structure above the second region includes a first set of dummy metal lines connected to the second set of vias, and a third portion of the interconnect structure above the third region includes a second set of dummy metal lines.

In some embodiments, a structure includes a substrate with an active region, a first dummy region surrounding the active region, and a second dummy region surrounding the first dummy region, a device layer disposed on the substrate, a via layer disposed on the device layer, an interconnect structure disposed on the via layer, and a redistribution layer disposed on the interconnect structure. A portion of the device layer above the active region includes devices disposed on the substrate and contact structures disposed on the devices. A first portion of the via layer above the active region includes a first set of vias and a second portion of the via layer in the first dummy region includes a second set of vias. A first portion of the interconnect structure above the active region includes a conductive structure connected to the contact structures through the first set of vias, a second portion of the interconnect structure above the first dummy region includes a metal structure connected to the second set of vias, and a third portion of the interconnect structure above the second dummy region includes an array of conductive stacks.

In some embodiments, a method includes forming a device layer on a substrate with a first die and a second die, forming a via layer on the device layer, and forming an interconnect structure on the via layer. Forming the interconnect structure includes forming a first portion of the interconnect structure with conductive lines in contact with devices in the device layer, and forming a second portion of the interconnect structure with a first set of dummy metal lines in contact with vias in the via layer. The method further includes depositing an insulating layer on the interconnect structure, and performing a die-singulation process. Performing the die-singulation process includes performing a lithographic process on a polymer layer to form first and second buffer layers with tapered side profiles on the first and second dies, respectively, performing a laser grooving process to form a trench in the substrate and between the first and second buffer layers, and performing a dicing process through the trench to separate the first die from the second die.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   a substrate with a first region, a second region surrounding the first region, and a third region surrounding the second region;
   a device layer disposed on the substrate, wherein a portion of the device layer above the first region comprises devices;
   a via layer disposed on the device layer, wherein a first portion of the via layer above the first region comprises a first set of vias and a second portion of the via layer above the second region comprises a second set of vias;

an interconnect structure disposed on the via layer, wherein a first portion of the interconnect structure above the first region comprises conductive lines connected to the devices, a second portion of the interconnect structure above the second region comprises a first set of dummy metal lines connected to the second set of vias, and a third portion of the interconnect structure above the third region comprises a second set of dummy metal lines; and a stress buffer layer with tapered side profiles disposed on the first and second portions of the interconnect structure.

2. The structure of claim 1, where a distance between adjacent dummy metal lines in the second set of dummy metal lines is about 40 nm to about 160 nm.

3. The structure of claim 1, wherein the second set of dummy metal lines covers about 30% to about 50% of a total surface area of the third region.

4. The structure of claim 1, wherein a width of each via in the second set of vias is about 20 nm to about 60 nm.

5. The structure of claim 1, wherein a total number of vias in the second set of vias is greater than 10.

6. The structure of claim 1, wherein the first set of vias are disposed on and in physical contact with contact structures of the device layer.

7. The structure of claim 1, wherein the second set of vias are disposed on and in physical contact with a dielectric layer.

8. The structure of claim 1, wherein at least one dummy metal line in the first set of dummy metal lines is in physical contact with a plurality of vias in the second set of vias.

9. The structure of claim 1, wherein the first region is a device region, the second region is a seal-ring region, and the third region is a scribe lane region.

10. The structure of claim 1, wherein sidewalls of the stress buffer layer form angles greater than about 50 degrees and less than about 90 degrees with a horizontal axis.

11. A structure, comprising:
a substrate with an active region, a first dummy region surrounding the active region, and a second dummy region surrounding the first dummy region;
a device layer disposed on the substrate, wherein a portion of the device layer above the active region comprises devices disposed on the substrate and contact structures disposed on the devices;
a via layer disposed on the device layer, wherein a first portion of the via layer above the active region comprises a first set of vias and a second portion of the via layer in the first dummy region comprises a second set of vias;
an interconnect structure disposed on the via layer, wherein:
a first portion of the interconnect structure above the active region comprises a conductive structure connected to the contact structures through the first set of vias,
a second portion of the interconnect structure above the first dummy region comprises a metal structure connected to the second set of vias, and
a third portion of the interconnect structure above the second dummy region comprises an array of conductive stacks that are arranged in an L-shaped pattern at a corner of the first dummy region; and
a redistribution layer disposed on the interconnect structure.

12. The structure of claim 11, where a distance between adjacent conductive stacks in the array of conductive stacks is about 40 nm to about 160 nm.

13. The structure of claim 11, wherein the array of conductive stacks covers about 30% to about 50% of a total surface area of the second dummy region.

14. The structure of claim 11, wherein a width of each via in the second set of vias is about 20 nm to about 60 nm.

15. The structure of claim 11, wherein a total number of vias in the second set of vias is greater than 10.

16. The structure of claim 11, further comprising a stress buffer layer with tapered side profiles disposed on the first and second portions of the interconnect structure and not on the third portion of the interconnect structure, wherein sidewalls of the stress buffer layer form angles greater than about 50 degrees and less than about 90 degrees with a horizontal axis.

17. A structure, comprising:
a substrate with an active region, a first dummy region surrounding the active region, and a second dummy region surrounding the first dummy region;
a device layer comprising devices disposed in the active region of the substrate;
a via layer comprising vias disposed on the device layer; and
an interconnect structure, comprising:
a first interconnect portion with conductive lines in the active region and in contact with the devices in the device layer;
a second interconnect portion with a first set of dummy metal lines in the first dummy region and in contact with the vias in the via layer; and
a third interconnect portion with a second set of dummy metal lines in the second dummy region and arranged in an L-shaped pattern at a corner of the first dummy region.

18. The structure of claim 17, wherein the second set of dummy metal lines covers about 30% to about 50% of a total surface area of the second dummy region.

19. The structure of claim 17, wherein a first set of the vias are disposed on and in contact with the device layer; and wherein a second set of the vias are disposed on and in contact with a dielectric layer.

20. The structure of claim 17, further comprising an insulating layer disposed on the interconnect structure and comprising an oxide layer and a nitride layer.

* * * * *